(12) United States Patent
Shimoda et al.

(10) Patent No.: US 12,444,617 B2
(45) Date of Patent: Oct. 14, 2025

(54) SEMICONDUCTOR WAFER PROCESSING LIQUID CONTAINING HYPOBROMITE IONS AND PH BUFFERING AGENT

(71) Applicant: TOKUYAMA CORPORATION, Yamaguchi (JP)

(72) Inventors: Takafumi Shimoda, Yamaguchi (JP); Yuki Kikkawa, Yamaguchi (JP); Tomoaki Sato, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 345 days.

(21) Appl. No.: 18/019,942

(22) PCT Filed: Aug. 6, 2021

(86) PCT No.: PCT/JP2021/029372
§ 371 (c)(1),
(2) Date: Feb. 6, 2023

(87) PCT Pub. No.: WO2022/030628
PCT Pub. Date: Feb. 10, 2022

(65) Prior Publication Data
US 2024/0014045 A1 Jan. 11, 2024

(30) Foreign Application Priority Data
Aug. 7, 2020 (JP) ................................. 2020-135398

(51) Int. Cl.
*H01L 21/3213* (2006.01)

(52) U.S. Cl.
CPC .............. *H01L 21/32134* (2013.01)

(58) Field of Classification Search
None
See application file for complete search history.

(56) References Cited

U.S. PATENT DOCUMENTS

| | | | |
|---|---|---|---|
| 12,195,658 B2 * | 1/2025 | Kikkawa | C23F 1/32 |
| 2005/0176603 A1 | 8/2005 | Hsu | |
| 2012/0256122 A1 | 10/2012 | Sato et al. | |
| 2016/0215170 A1 * | 7/2016 | Tamada | C09G 1/02 |
| 2017/0081553 A1 * | 3/2017 | Tamada | C09K 3/1463 |
| 2017/0275498 A1 * | 9/2017 | Tamada | C09K 3/1463 |
| 2018/0057711 A1 * | 3/2018 | Onishi | C09G 1/02 |
| 2018/0197746 A1 | 7/2018 | Bilodeau | |
| 2019/0077991 A1 * | 3/2019 | Shinoda | H01L 21/30625 |
| 2021/0180192 A1 | 6/2021 | Sugimura et al. | |
| 2021/0403323 A1 * | 12/2021 | Negishi | B01F 25/43 |
| 2022/0328320 A1 * | 10/2022 | Kikkawa | C23F 1/46 |
| 2023/0126771 A1 * | 4/2023 | Kikkawa | C23F 1/38 |
| | | | 438/754 |

FOREIGN PATENT DOCUMENTS

| | | |
|---|---|---|
| JP | 2005-227749 | 8/2005 |
| JP | 2018-519674 | 7/2018 |
| WO | 2011/074601 | 6/2011 |
| WO | 2020/054296 | 3/2020 |

OTHER PUBLICATIONS

International Search Report issued Nov. 2, 2021 in corresponding International Application No. PCT/JP2021/029372.

* cited by examiner

*Primary Examiner* — Allan W. Olsen
(74) *Attorney, Agent, or Firm* — Wenderoth, Lind & Ponack, L.L.P.

(57) ABSTRACT

Provided is a treatment liquid for treating a semiconductor wafer in a semiconductor forming process, the treatment liquid containing (A) a hypobromite ion, (B) a pH buffer, and (C) an onium ion represented by formula (1):

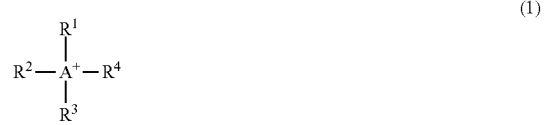

(wherein $R^1$, $R^2$, $R^3$, and $R^4$ each independently denote an alkyl group having carbon number from 1 to 25,)

18 Claims, 1 Drawing Sheet

SEMICONDUCTOR WAFER PROCESSING LIQUID CONTAINING HYPOBROMITE IONS AND PH BUFFERING AGENT

TECHNICAL FIELD

The present invention relates to a novel treatment liquid for etching ruthenium present on a semiconductor wafer. The treatment liquid is used in manufacturing a semiconductor element.

BACKGROUND ART

In recent years, design rules for semiconductor elements have advanced in a direction of further miniaturization, and in association therewith, there has been a tendency for an increase in wiring resistance. A hindrance in high-speed operation of semiconductor elements as a result of this increase in wiring resistance has become obvious, and thus countermeasures have become necessary. Therefore, a wiring material is desired to have improved electromigration resistance and a reduced resistance value compared to known wiring materials.

In comparison to the known wiring materials of aluminum and copper, ruthenium exhibits higher electromigration resistance and can reduce the resistance value of wiring, and for this reason, ruthenium is attracting attention particularly as a wiring material for semiconductor elements based on a design rule of 10 nm or less. Ruthenium can prevent electromigration even when copper is used as the wiring material, and therefore the use of ruthenium as a barrier metal for copper wiring is also being examined in addition to use as a wiring material.

Incidentally, even when ruthenium is selected as a wiring material in a wiring formation process of a semiconductor element, the wiring is formed by dry or wet etching, similar to known wiring materials. However, problems have existed when ruthenium is dry etched. Namely, in-plane non-uniformity attributed to the distribution of plasma occurs, and the etching rate fluctuates depending on the flux or energy of the reactive species and ions, and therefore precision etching becomes difficult. Thus, wet etching has been attracting attention as a method for etching ruthenium with greater precision.

Here, when ruthenium is used as a wiring material or barrier metal when implementing ultra-fine processing such as with a semiconductor element design rule of 10 nm or less, precise processing of ruthenium is required in wet etching. That is, if the etching amount of ruthenium is not controlled, other wiring materials may be exposed due to reasons such as excessive etching of the ruthenium. Moreover, if multilayer wiring is formed with a wiring material other than ruthenium being exposed, current leakages occur, starting from the exposed wiring material, and the semiconductor element does not operate correctly. Therefore, a semiconductor treatment liquid capable of realizing precision processing of ruthenium is desired.

A semiconductor treatment liquid that Patent Document 1 proposes for etching ruthenium is an etching liquid obtained by adding and mixing a bromine-containing compound, an oxidizing agent, a basic compound, and water. The etching liquid is characterized in that relative to the total mass, the added amount of the bromine-containing compound is from 2 to 25 mass % in terms of the amount of the bromine element, the added amount of the oxidizing agent is from 0.1 to 12 mass %, and the pH is 10 or more and less than 12.

CITATION LIST

Patent Documents

Patent Document 1: WO 2011/074601

SUMMARY OF INVENTION

Technical Problem

The treatment liquid described in Patent Document 1 is useful in terms of having a high etching rate in relation to ruthenium. However, an examination by the present inventors revealed that the known treatment liquid described in Patent Document 1 has room for improvement in the following area.

That is, Patent Document 1 indicates that in the semiconductor water manufacturing, the treatment liquid described in Patent Document 1 is used in each process of manufacturing semiconductor elements, wirings, and barrier metals. However, the purpose of the treatment liquid is to remove ruthenium adhered to the substrate such as the semiconductor wafer, and is not to achieve precision etching. Therefore, when ruthenium is etched with the treatment liquid described in Patent Document 1, the etching rate is difficult to control, which is a problem. Furthermore, the stability of the treatment liquid is poor, and thus problems with the stability of the etching rate have existed. Therefore, with the treatment liquid described in Patent Document 1, the etching amount of ruthenium cannot be precisely controlled, and thus room for further improvement exists.

Solution to Problem

The present inventors conducted diligent research to solve the above problems. It was surmised that with a treatment liquid containing only a hypobomite ion, the etching rate of ruthenium is unstable due to large fluctuations in the pH of the treatment liquid and in the concentration of the hypobomite ion, and as a result, it is difficult to control the amount of ruthenium to be etched. Therefore, the present inventors examined components to be added to the treatment liquid. As a result of this examination, the inventors discovered that adding onium ions and a pH buffer to the treatment liquid containing a hypobomite ion can reduce fluctuations in the pH of the treatment liquid and in the concentration of the hypobomite ion, and enables the ruthenium etching rate to be controlled. The inventors also discovered that through this, the etching amount can be precisely controlled. The present inventors also confirmed that the treatment liquid containing a specific anion such as a bromite ion and/or bromate ion maintains the concentration of the hypobromite ion in the treatment liquid uniformly, and the stability of the treatment liquid is improved. Through this, the present inventors discovered that the stability of the etching rate of ruthenium can be improved, and thereby the inventors arrived at the present invention.

That is, the present invention includes the following aspects.

Aspect 1: A semiconductor treatment liquid containing:
(A) a hypobromite ion
(B) a pH butler
(C) an onium ion.

Aspect 2: The semiconductor treatment liquid according to aspect 1, further containing (D) a bromide ion.

Aspect 3: The semiconductor treatment liquid according to aspect 1 or 2, further containing (E) a bromite ion and/or bromate Aspect 4: The semiconductor treatment liquid according to any one of aspects 1 to 3, wherein a total of concentrations of the bromite ion and bromate ion (E) is $3.3 \times 10^{-6}$ mol/L or more and $5.0 \times 10^{-1}$ mol/L or less.

Aspect 5: The semiconductor treatment liquid according to any one of aspects 1 to 4, further containing an oxidizing agent, wherein an oxidation-reduction potential of the oxidizing agent exceeds an oxidation-reduction potential of a hypobromite ion/bromide ion.

Aspect 6: The semiconductor treatment liquid according to aspect 5, wherein the oxidizing agent contained in the semiconductor treatment liquid is a hypochlorite ion and/or ozone.

Aspect 7: The semiconductor treatment liquid according to any one of aspects 1 to 6, further containing (F) one or more chlorine-containing ions selected from the group consisting of a chlorite ion, a chlorate ion, and a chloride ion.

Aspect 8: The semiconductor treatment liquid according to any one of aspects 1 to 7, wherein the hypobomite ion are contained at an amount of 0.001 mol/L or more and 0.20 mol/L or less.

Aspect 9: The semiconductor treatment liquid according to any one of aspects 1 to 8, wherein the concentration of the pH buffer (B) is from 0.00001 to 1.0 mol/L.

Aspect 10: The semiconductor treatment liquid according to any one of aspects 1 to 9, wherein the pH buffer (B) is at least one selected from the group consisting of carbonic acid, boric acid, phosphoric acid, tris(hydroxymethyl)aminomethane (tris), ammonia, pyrophosphoric acid, p-phenolsulfonic acid, diethanolamine, ethanolamine, triethanolamine, 5,5-diethylbarbituric acid, glycine, glycylglycine, imidazole, N,N-bis(2-hydroxyethyl)-2-aminoethanesulfonic acid, 3-morpholinopropanesulfonic acid, N-tris(hydroxymethyl) methyl-2-aminoethanesulfonic acid ; 2-[4-(2-hydroxyethyl)-1-piperazinyl] ethanesulfonic acid, 4-(2-hydroxyethyl)-1-piperazinepropanesulfonic acid, tricine, N,N-di(2-hydroxyethyl)glycine, 2-cyclohexylaminoethane sulfonic acid, hydroxyproline, phenol, and ethylene diamine tetraacetic acid.

Aspect 11: The semiconductor treatment liquid according to any one of aspects 1 to 10, wherein the onium ion (C) is a quaternary ammonium ion or a quaternary phosphonium ion represented by formula (I), a tertiary ammonium ion or a tertiary sulfonium ion represented by formula (2), an ammonium ion, a pyrrolidinium ion, a piperidinium ion, an imidazolium ion, or a sulfonium ion represented by formula (3), or an ammonium ion or a phosphonium ion represented by formula (4):

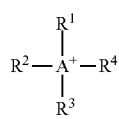

(1)

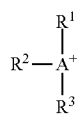

(2)

(3)

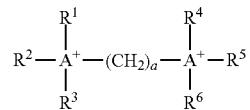

(4)

(In formula (1), A is nitrogen or phosphorus, and $R^1$, $R^2$, $R^3$, and $R^4$ each independently denote an alkyl group having carbon number from 1 to 25, an allyl group having carbon number from 1 to 25, an aralkyl group in which an aryl group optionally have a substituent, or an aryl group, with the proviso that, in a case in which $R^1$, $R^2$, $R^3$, and $R^4$ are alkyl groups, the number of carbons of at least one alkyl group among $R^1$, $R^2$, $R^3$, and $R^4$ is two or more.

In formula (2), A is nitrogen or sulfur, and $R^1$, $R^2$, and $R^3$ each independently denote an alkyl group having carbon number from 1 to 25, an allyl group, an aralkyl group having an alkyl group having carbon number from 1 to 25, or an aryl group, with the proviso that, in a case in which $R^1$, $R^2$, and $R^3$ are alkyl groups, the number of carbons of at least one alkyl group among $R^1$, $R^2$, and $R^3$ is two or more. Furthermore, in an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9, or an alkenyloxy group having carbon number from 2 to 9, and in these groups, at least one hydrogen optionally is substituted with fluorine or chlorine.

In formula (3), Z is an aromatic or alicyclic group that optionally include a nitrogen atom, a sulfur atom, or an oxygen atom, and in the aromatic or alicyclic group, at least one hydrogen to which carbon or nitrogen binds optionally is substituted with chlorine, bromine, fluorine, iodine, at least one alkyl group having carbon number from 1 to 15, at least one alkenyloxy group having carbon number from 2 to 9, an aromatic group that optionally is substituted with at least one alkyl group having carbon number from 1 to 15, or an alicyclic group that optionally is substituted with at least one alkyl group having carbon number from 1 to 15. A is nitrogen or sulfur. R is chlorine, bromine, fluorine, iodine, an alkyl group, an allyl group, an aromatic group that optionally is substituted with at least one alkyl group having carbon number from 1 to 15, or an alicyclic group that optionally is substituted with at least one alkyl group having carbon number from 1 to 15. n is an integer of 1 or 2 and indicates the number of R. When n is 2, two R groups optionally are the same or different, and optionally form a ring.

In formula (4), A is independently nitrogen, or phosphorus, and $R^1$, $R^2$, $R^3$, $R^4$, $R^5$, and $R^6$ are each independently an alkyl group having carbon number from 1 to 25, an allyl group, an aralkyl group having an alkyl group having carbon number from 1 to 25, or an aryl group. In an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9, or an alkenyloxy group having carbon number from 2 to 9, and in these groups, at least one hydrogen optionally is substituted with fluorine or chlorine).

Aspect 12: The semiconductor treatment liquid according to any one of aspects 1 to 11, wherein the pH at 25° C. is 8 or higher and 14 or less.

Aspect 13: An etching method including causing contact between the semiconductor treatment liquid according to any one of aspects 1 to 12 and a semiconductor wafer.

Aspect 14: The etching method according to aspect 13, wherein a metal on the semiconductor wafer is ruthenium or tungsten, and the ruthenium or the tungsten is etched.

Aspect 15: An inhibitor for $RuO_4$-containing gas generation, the inhibitor containing:
(A) a hypobomite ion
(B) a pH buffer
(C) an onium ion.

Aspect 16: The inhibitor for $RuO_4$-containing gas generation according to aspect 15, further containing (D) a bromide ion.

Aspect 17: The inhibitor for $RuO_4$-containing gas generation according to aspect 15 or 16, further containing (E) a bromite ion and/or a bromate ion.

Aspect 18: The inhibitor for $RuO_4$-containing gas generation according to any one of aspects 15 to 17, further containing (F) one or more chlorine-containing ions selected from the group consisting of a chlorite ion, a chlorate ion, and a chloride ion.

Aspect 19: A treatment agent for a ruthenium-containing waste liquid, the treatment agent containing:
(A) a hypobomite ion
(B) a pH buffer
(C) an onium ion.

Aspect 20: The treatment agent for a ruthenium-containing waste liquid according to aspect 19, further containing (D) a bromide ion.

Aspect 21: The treatment agent for a ruthenium-containing waste liquid according to aspect 19 or 20, further containing (E) a bromite ion and/or bromate ion.

Aspect 22: The treatment agent for a ruthenium-containing waste liquid according to any one of aspects 19 to 21, further containing (F) one or more chlorine-containing ions selected from the group consisting of a chlorite ion, a chlorate ion, and a chloride ion.

Effects of the Invention

The treatment liquid of the present invention can reduce changes in pH associated with an etching reaction of ruthenium or the absorption of carbon dioxide gas during etching ruthenium. The treatment liquid of the present invention can reduce changes in an etching rate due to the decomposition of hypobromite ions that occurs during storage, too. As a result, the etching rate during use can be maintained at a constant level, and thus, a treatment liquid that can stably ensure precision processing can be provided. Adding, to the treatment liquid, bromite ions, bromate ions, chlorite ions, chlorate ions, and/or chloride ions can further suppress the decomposition of hypobromite ions in the treatment liquid.

DESCRIPTION OF EMBODIMENTS

Semiconductor Treatment Liquid

The treatment liquid of the present invention can etch ruthenium present on a semiconductor wafer without damaging the semiconductor wafer, and can etch ruthenium at an etching rate with minimal variation. Thus, the treatment liquid of the present invention can be suitably used in a wiring formation process in manufacturing a semiconductor.

Figure 1:
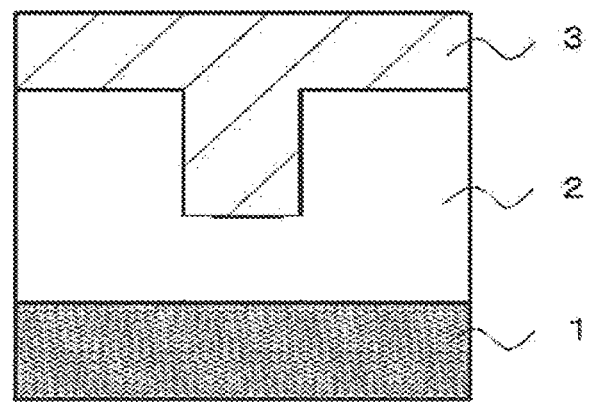
FIG. 1 is a schematic cross-sectional view illustrating an example of a wiring formation process in which the treatment liquid of the present invention can be suitably used.
Figure 2:
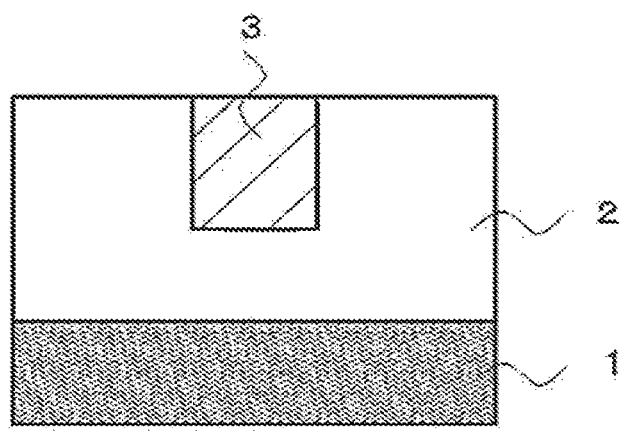
FIG. 2 is a schematic cross-sectional view illustrating an example of a wiring formation process after treatment with the treatment liquid of the present invention.

The ruthenium to which the treatment liquid of the present invention is applied can be formed as a film by any method, and, for example, is formed on a semiconductor wafer by a known method such as CVD, ALD, or sputtering in a semiconductor manufacturing process. The formed ruthenium is etched by the treatment liquid to thereby form a semiconductor wiring. In the present specification, ruthenium (also described as Ru) is not limited to ruthenium metal and need only include the ruthenium element. That is, a ruthenium metal, a ruthenium alloy, a ruthenium oxide, and the like are referred to as ruthenium. An example of a wiring formation process is illustrated in FIGS. 1 and 2. An interlayer insulating film 2 formed from a silicon oxide film, a low dielectric constant film, or the like is provided on a lower base 1, and a ruthenium film 3 is formed the interlayer insulating film 2. The ruthenium film 3 is etched as illustrated in FIG. 2, and thereby wiring in which the ruthenium is used as a wiring material is formed.

The treatment liquid of the present invention can be suitably used for etching ruthenium as described above. Furthermore, the treatment liquid is a treatment liquid containing (A) a hypobomite ion, (B) a pH buffer, and (C) an onium ion. These components will be described in order below.

(A) Hypobromite Ion

The hypobomite ion used in the present invention is added to oxidize the ruthenium and dissolve the ruthenium in the treatment liquid. The hypobromite ion can be added to the treatment liquid by any method, and examples of the methods thereof include a method in which the hypobromite ion is produced in the treatment liquid, and a method in which a salt including a hypobromite ion is added to the treatment liquid. To produce a hypobromite ion in the treatment liquid, bromine is supplied into the treatment liquid. In this case, from the viewpoint of efficiently producing a hypobromite ion, the treatment liquid is preferably at a temperature of or lower. When the temperature of the treatment liquid is 50° C. or lower, not only can hypobromite ion be efficiently produced, but the produced hypobromite ion can be also stably used to etch ruthenium. Furthermore, to dissolve more bromine in the treatment liquid, the temperature of the treatment liquid is more preferably 30° C. or lower and most preferably 25° C. or lower. The lower limit of the temperature of the treatment liquid is not particularly limited, but the treatment liquid preferably does not freeze. Thus, the treatment liquid is preferably at −35° C. or higher, more preferably at −15° C. or higher, and most preferably at 0° C. or higher. The pH of the treatment liquid to which the bromine is supplied is not particularly limited, but if the pH of the treatment liquid is alkaline, the treatment liquid is immediately available for etching ruthenium after the production of the hypobromite ion.

In the case in which a hypobromite ion is produced by supplying bromine into the treatment liquid, a bromide ion ($Br^-$) contained in the treatment liquid improves the solubility of bromine ($Br_2$). This is because $Br_2$ dissolved in the treatment liquid reacts with $Br^-$ and $Br_3^-$ and forms a complexion, such as $Br_3^-$ or $Br_{5-}$, which is stabilized in the treatment liquid. The treatment liquid containing a large amount of $Br_2$, $Br^-$, $Br_5^-$ can form more hypobromite ions and thus can be suitably used as the treatment liquid according to an embodiment of the present invention.

Another example of a method for producing a hypobromite ion in the treatment liquid is a method of oxidizing a bromine-containing. compound using an oxidizing agent. The bromine-containing compound can be any compound as long as the compound includes a bromine atom and is oxidized by an oxidizing agent other than the hypobromite ion described below to produce bromine, hypobromous acid, and hypobromite ion. The bromine produced from the bromine-containing compound changes to a hypobromite ion as described above. Furthermore, some or all of the hypobromous acid produced from the bromine-containing compound is converted to hypobromite ions, and the hypobromite ions to etch the ruthenium. As an example of the bromine-containing compound, at least one selected from the group consisting of bromine salts and hydrogen bromide is preferably used. Hydrogen bromide referred to here can be hydrogen bromide gas or hydrobromic acid, which is an aqueous solution of hydrogen bromide. Examples of the bromine salt can include lithium bromide, sodium bromide, potassium bromide, rubidium bromide, cesium bromide, ammonium bromide, and onium bromide. The onium bromide referred to here is a compound formed of an onium ion and a bromide ion. An onium ion is a compound of a polyatomic cation formed by addition of excess protons (hydrogen cations) to a monatomic anion. Specifically, the onium ion is a cation, such as an imidazolium ion, a pyrrolidinium ion, a pyridinium ion, a piperidinium ion, an ammonium ion, a phosphonium ion, a fluoronium ion, a chioroniuni ion, a bromonium ion, an iodonium ion, an oxonium ion, a sulfonium ion, a selenonium ion, a telluronium ion, an arsonium ion, a stibonium ion, and a bismuthonium ion. In addition, a compound that produces hypobromous acid or a hypobromite ion in the treatment liquid can also be suitably used as the bromine-containing compound. Examples of such compounds include, but are not limited to, bromohydantoins, bromoisocyanuric acids, bromosulfamic acids, and bromochloramines. The compound is more specifically exemplified by 1-bromo-3-chloro-5,5-dimethylhydantoin, 1,3-dibromo-5,5-dimethylhydantoin, and tribromoisocyanuric acid.

To add hypobromite ions as a compound to the treatment liquid, hypobromous acid, bromine water, or a hypobromite salt is added. The hypobromite salt is suitably sodium hypobromite, potassium hypobromite, or a tetraalkylammonium hypobromite, and from the viewpoint of controlling the amount of metal ions that are problematic in semiconductor manufacturing, hypobromous acid or a tetraalkylammonium hypobromite is more suitable.

The tetraalkylammonium hypobromite is easily produced by passing bromine gas through a tetraalkylammonium hydroxide solution. In addition, the tetraalkylammonium hypobromite is also formed by mixing hypobromous acid and a tetraalkylammonium hydroxide solution. Furthermore, the tetraalkylammonium hypobromite can also be formed by replacing a cation contained in a hypobromite salt, such as sodium hypobromite, with a tetraalkylammonium ion using an ion exchange resin.

The concentration of the hypobromite ion in the treatment liquid is not particularly limited as long as the treatment liquid does not depart from the object of the present invention, but the concentration thereof is preferably 0.001 mold, or more and 0.20 mol/L or less in terms of the amount of bromine element contained in the hypobromite ion. When the concentration is less than 0.001 mol/L, the rate at which the ruthenium is etched is low, and thus practicality is reduced. On the other hand, when the concentration exceeds 0.2 mol/L, the hypobromite ion is easily decomposed, and thus, the etching rate of the ruthenium is less likely to be stable. To stably etch the ruthenium at a sufficient rate, the concentration of the hypobromite ion is preferably 0.001 mol/L or more and 0.20 mol/L or less, more preferably 0.005 mol/L or more and 0.20 mol/L or less, and most preferably 0.01 mol/L or more and 0.10 mol/L, or less.

The concentration of the hypobromite ion in the treatment liquid can be determined using a widely known method. For example, using ultraviolet-visible absorption spectroscopy, absorption due to hypobromite ions can be easily observed and the hypobromite ion concentration can be determined from the intensity of the absorption peak (generally at or near 330 nm although this depends on the pH of the treatment liquid and the hypobromite ion concentration). Furthermore, the hypobromite ion concentration can also be determined by iodine titration. In addition, the hypobromite ion concentration can be determined from the oxidation-reduction potential (ORP) and pH of the treatment liquid. The measurement by ultraviolet-visible absorption spectroscopy is most preferred from the viewpoint of enabling contactless and continuous measurement. In measuring the hypobromite ion concentration by ultraviolet-visible absorption spectroscopy, when absorption due to another chemical species is present, the hypobromite ion concentration can be determined with sufficient accuracy by data processing, such as spectral splitting or baseline correction, properly selecting the reference, or the like.

An acid dissociation constant ($pK_a$) of hypobromous acid (HBrO) and the hypobromite ion ($BrO^-$) is 8.6, and thus there may be a case where HBrO and $BrO^-$ coexist depending on the pH of the treatment liquid, such as at low pH. In the case of a treatment liquid containing HBrO and $BrO^-$, the total concentration of HBrO and $BrO^-$ can be used as the concentration of the hypobromite ion.

Although the details of the mechanism in which the hypobromite ion dissolve the ruthenium are not necessarily obvious, it is speculated that the hypobromite ion or hypobromous acid resulting from the hypobromite ion oxidizes the ruthenium to form $RuO_4$, $RuO_4^-$ or $RuO_4^{2-}$, and thereby the ruthenium is dissolved in the treatment liquid. When the ruthenium is dissolved as $RuO_4^-$ or $RuO_4^{2-}$, the amount of $RuO_4$ gas that is produced is reduced, and the generation of $RuO_2$ particles can be suppressed. In order to dissolve the ruthenium as $RuaO_4^-$ or $RuO_4^{2-}$, the pH of the treatment liquid is preferably alkaline, and the pH of the treatment liquid is more preferably 8 or higher and 14 or less, even more preferably 12 or higher and 14 or less, and most preferably 12 or higher and less than 13. If the pH of the treatment liquid is 12 or higher and less than 13, the ruthenium is dissolved as $RuO_4^-$ or $RuO_4^{2-}$ in the treatment liquid, and therefore the amount of $RuO_4$ gas that is produced is significantly reduced, and the generation of $RuO_2$ particles can be suppressed. On the other hand, when the pH of the treatment liquid is less than 8, the ruthenium is easily oxidized to $RuO_2$ and $RuO_4$, and therefore the amount of $RuO_2$ particles increases, and the amount of $RuO_4$ gas that is produced tends to increase.

(B) pH Buffer

The pH buffer used in the present invention is a combination of a weak acid and a conjugate base, and is added to the treatment liquid for the purpose of reducing fluctuation iii hydrogen ions in the treatment liquid.

The mechanism that enables the treatment liquid of the present invention to precisely control the etching rate of ruthenium is considered to be as follows. That is, even when the pH of the treatment liquid fluctuates, the conjugate base of the pH buffer present in the treatment liquid undergoes a neutralizing reaction with the hydrogen ions, and thereby fluctuations in the pH of the treatment liquid can be reduced, and the etching rate of the ruthenium can be controlled to a constant level.

The pH buffer is a substance that has a pH buffering capacity, and can be used without limitation as long as the pH buffer is a combination of a weak acid and a conjugate base. Specific examples of cationic pH buffers that can be suitably used in the present invention can include carbonic acid, boric acid, phosphoric acid, tris(hydroxymethyl)aminomethane (tris), ammonia, pyrophosphoric acid, p-phenolsulfonic acid, diethanolamine, ethanolamine, triethanolamine, 5,5-diethylbarbituric acid, glycine, glycylglycine, imidazole, N,N-bis(2-hydroxyethyl)-2-aminoethanesulfonic acid, 3-morpholinopropanesulfonic acid, N-tris(hydroxymethyl) methyl-2-aminoethanesulfonic acid, 2-[4-(2-hydroxyethyl)-1-piperazinyl] ethanesulfonic acid, 4-(2-hydroxyethyl)-1-piperazinepropanesulfonic acid, tricine, N,N-di(2-hydroxyethyl)glycine, 2-cyclohexylaminoethane sulfonic acid, hydroxyproline, phenol, and ethylene diamine tetraacetic acid.

In the present invention, a pH buffer can be added alone, or two or more pH buffers can be combined and added. Combining two or more pH buffers can suppress variations in the pH in a wide pH range. In addition, in the present specification, pH is described as a value at 25° C.

Note that at least one type of pH buffer selected from the group consisting of boric acid, carbonic acid, and phosphoric acid is preferably used as the pH buffer in the present invention. In particular, a desirable pH buffering capacity can be anticipated when the pH of the treatment liquid is from 8.2 to 10.2 in a case in which boric acid is used, when the pH of the treatment liquid is from 9.3 to 11.3 in a case in which carbonic acid is used, and when the pH of the treatment liquid is from 11.4 to 13.4 in a case in which phosphoric acid is used. The pH buffer of these can be used alone, or a plurality of these pH buffers can be mixed and used. Furthermore, when ruthenium is to be etched, a pH buffer that does not adsorb on the surface of the ruthenium is preferably used.

In the present invention, the concentration of the pH buffer of the treatment liquid is preferably from 0.0001 to 1.0 mol/L, more preferably from 0.0001 to 0.8 mol/L, and even more preferably from 0.001 to 0.6 mol/L, of the treatment liquid.

When the content of the pH buffer in the treatment liquid of the present invention is in a range from 0.0001 to 1.0 mol/L, the pH of the treatment liquid can be stabilized, and furthermore, an increase in the viscosity of the treatment liquid can be suppressed, and thus such a content of the pH buffer is preferable. When a plurality of pH buffers is included in the treatment liquid, the concentration of each pH buffer is preferably in the range from 0.0001 to 1.0 mol/L. In a case in which the viscosity of the treatment liquid is high, application in a miniaturized wiring process tends to become difficult, and therefore the content of the pH buffer is preferably in the abovementioned range. Furthermore, when the concentration of the pH buffer is within the range described above, the pH buffer is sufficiently dissolved in the treatment liquid, and therefore the substance to be etched is not contaminated by re-precipitation or the like of the pH buffer, and thus such a concentration is preferable.

The mechanism whereby the treatment liquid of the present invention can reduce fluctuations in the etching rate of ruthenium through the addition of a pH buffer is considered to be as follows. That is, even if the pH of the treatment liquid fluctuates, the conjugate base of the pH buffer present in the treatment liquid undergoes a neutralizing reaction with the hydrogen ions, and thereby fluctuations in the pH of the treatment liquid due to disturbances such as the absorption of carbonic acid gas contained in outside air and an etching reaction can be reduced. As a result, it is contemplated that fluctuations in the etching rate of the ruthenium can be reduced.

(C) Onium Ion

In the present invention, an onium ion represented by any of formulas (1) to (4) is contained in the treatment liquid to adjust the pH of the treatment liquid.

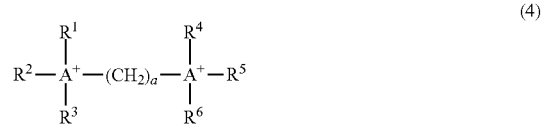

(In formula (1), $A^+$ is an ammonium ion or a phosphonium ion, and $R^1$, $R^2$, $R^3$, and $R^4$ each independently denote an alkyl group having carbon number from 1 to 25, an allyl group, an aralkyl group in which an aryl group optionally have a substituent, or an aryl group, with the proviso that, in a case in which $R^1$, $R^2$, $R^3$, and $R^4$ are alkyl groups, the number of carbons of at least one alkyl group among $R^1$, $R^2$, $R^3$, and $R^4$ is two or more. Furthermore, in an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9, or an alkenyloxy group laving carbon number from 2 to 9, and in these groups, at least one hydrogen optionally is substituted with fluorine or chlorine, and the alkyl group in the aralkyl group preferably has carbon number from 1 to 25.

In formula (2), $A^+$ is a sulfonium ion, and $R^1$, $R^2$, and $R^3$ each independently denote an alkyl group having carbon number from 1 to 25, an allyl group, an aralkyl group having an alkyl group having carbon number from 1 to 25, or an aryl group, with the proviso that, in a case in which $R^1$, $R^2$, and $R^3$ are alkyl groups, the number of carbons of at least one alkyl group among $R^1$, $R^2$, and $R^3$ is two or more. Furthermore, in an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9, or an alkenyloxy group having carbon number from 2 to 9, and in these groups, at least one hydrogen optionally is substituted with fluorine or chlorine.

In formula (3), Z is an aromatic or alicyclic group that optionally include a nitrogen atom, a sulfur atom, or an oxygen atom, and in the aromatic or alicyclic group, at least one hydrogen to which carbon or nitrogen binds optionally is substituted with chlorine, bromine, fluorine, iodine, at least one alkyl group having carbon number from 1 to 15, at least one alkenyloxy group having carbon number from 2 to 9, an aromatic group that optionally is substituted with at least one alkyl group having carbon number from 1 to 15, or an alicyclic group that optionally is substituted with at least one alkyl group having carbon number from 1 to 15. A is nitrogen or sulfur. R is chlorine, bromine, fluorine, iodine, an alkyl group having carbon number from 1 to 15, an allyl group, an aromatic group that optionally is substituted with at least one alkyl group having carbon number from 1 to 15, or an alicyclic group that optionally is substituted with at least one alkyl group having carbon number from 1 to 15, n is an integer of 1 or 2 and indicates the number of R. When n is 2, two R groups optionally are the same or different, and optionally form a ring.

In formula (4), each $A^+$ is independently an ammonium ion or a phosphonium ion, and $R^1$, $R^2$, $R^3$, $R^4$, $R^5$, and $R^6$ are each independently an alkyl group having carbon number from 1 to 25 an allyl group, an aralkyl group having an alkyl group having carbon number from 1 to 25, or an aryl group. In an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9, or an alkenyloxy group having carbon number from 2 to 9, and in these groups, at least one hydrogen optionally is substituted with fluorine or chlorine.)

In the treatment liquid according to an embodiment of the present invention, the concentration range of the onium ion is preferably from 0.000001 to 5.0 mol/L. Ruthenium can be etched when the concentration of the onium ion satisfies this range. As a result, a treatment liquid having excellent long-term storage stability and that can be used to stably implement etching can be obtained. In order to better exhibit this effect, the concentration of the onium ion is more preferably from 0.00001 to 3.0 mol/L, and even more preferably from 0.00001 to 2.0 mol/L. Note that the above-mentioned concentration ranges, preferable concentration ranges, and more preferable concentration ranges are applicable to any specific examples such as onium ions represented by formulas (1) to (4) as exemplified by tetramethylammonium ions. Note that "optionally is substituted" is meant to include both "substituted" and "not substituted".

The onium ion (C) contained in the treatment liquid has an effect of reducing roughness of the ruthenium surface after the ruthenium has been etched. While the reason for this effect is not clear, it is contemplated that this effect is achieved because bulky onium ions are adsorbed on the ruthenium surface due to electrostatic interaction, and thereby the reaction between the hypobromite ion and the ruthenium is slowed, and the surface can be uniformly etched.

pH Adjusting Agent

The pH adjusting agent of the present invention is an acid or alkali, differing from the onium ion and pH buffer described above. Examples of the pH adjusting agent include acids such as hydrochloric acid, sulfuric acid, or nitric acid, and alkalis such as an alkylammonium hydroxide, including tetramethylammonium hydroxide, or choline, for example.

Note that in the present invention, when a pH buffer is included in the treatment liquid, the range in which the pH is stable is determined by a combination of the pH adjusting agent and the pH buffer in the treatment liquid. For example, in a case in which an aqueous solution of tetramethylammonium hydroxide is used as the pH adjusting agent and boric acid is used as the pH buffer, the pH of the treatment liquid can be stabilized in a range from 8.2 to 10.2, and fluctuations in the etching rate of the ruthenium can be reduced. Furthermore, since a compound containing an alkali metal such as potassium hydroxide or sodium hydroxide is not used as the pH adjusting agent, alkali metal contamination such as potassium or sodium is not observed on the semiconductor substrate surface after etching, and thus such a combination can be favorably used.

Oxidizing Agent

The treatment liquid of the present invention preferably contains an oxidizing agent other than the hypobromite ion. The oxidizing agent contained in the treatment liquid of the present invention oxidizes bromide ions (Br⁻), which are produced by decomposition of hypobromite ions, to hypobromite ions once again. Accordingly, the oxidizing agent that can be contained in the treatment liquid is preferably one for which the oxidation-reduction potential between the oxidizing agent and a chemical species produced by reduction of the oxidizing agent exceeds the oxidation-reduction potential of a hypobromite ion/bromide ion system. When such an oxidizing agent is used, the bromide ions can be oxidized to hypobromite ions. The oxidation-reduction potential of the hypobromite ion/bromide ion system is the oxidation-reduction potential in the following reaction equation (5), and means the potential in an equilibrium state between the hypobromite ion, which are the oxidant in the solution, and the bromide ions, which are the reductant in the solution.

$$BrO^-+2H_2O+2e^-\to Br^-3\ 2OH^- \qquad (5)$$

That is, the matter of the oxidation-reduction potential of the oxidizing agent exceeding the oxidation-reduction potential of the hypobromite ion/bromide ion system means that the oxidation-reduction potential between the oxidizing agent and the chemical species produced by reduction of the oxidizing agent exceeds the oxidation-reduction potential of the system including the hypobromite ions and the bromide ions produced by reduction of the hypobromite: ions.

The oxidation-reduction potential between the oxidizing agent that can be contained in the treatment liquid and the chemical species produced by reduction of the oxidizing agent varies depending on factors such as the concentrations of the oxidizing agent and chemical species produced by reduction of the oxidizing agent, and the temperature and pH of the solution. However, regardless of these conditions, the oxidation-reduction potential between the oxidizing agent and the chemical species produced by reduction of the oxidizing agent only needs to exceed the oxidation-reduction potential of the hypobromite ion/bromide ion system in the treatment liquid. The oxidation-reduction potential of these oxidation-reduction species can be determined by measuring as a potential with respect to a reference electrode (e.g., a standard hydrogen electrode (SHE) or silver/silver chloride electrode), and can be calculated using the standard oxidation-reduction potential described in a database (e.g., "Electrochemical Handbook, 6th Edition", The Electrochemical Society of Japan, Maruzen Publishing Co., 2013, pp. 92-95, or "CRC Handbook of Chemistry and Physics, 87th edition", David R. Lide ed., CRC Press, pp. 8-20 to 8-30), with consideration of the concentration of the oxidation-reduction species, the pH, the temperature, and the like.

On the other hand, for the oxidizing agent that can be contained in the treatment liquid, the upper limit of the oxidation-reduction potential between the oxidizing agent and the chemical species produced by reduction of the oxidizing agent is not particularly limited as long as it does not depart from the object of the present invention. However, in a case in which a semiconductor wafer containing ruthenium is to be treated with the treatment liquid of the present invention containing an oxidizing agent, when the oxidation-reduction potential is higher than the oxidation-reduction potential of the $RuO_4^-/RuO_4$ system (1.0V vs. SHE), the $RuO_4^-$ dissolved in the treatment liquid is oxidized by the oxidizing agent to $RuO_4$, and the amount of $RuO_4$ gas generation could possibly increase. In such a case, oxidation from $RuO_4^-$ to $RuO_4$ can be suppressed, and the amount of $RuO_4$ generation can be controlled by appropriately adjusting the amount of the oxidizing agent added to the treatment liquid and the timing at which the oxidizing agent is added.

Specific examples of such an oxidizing agent include nitric acid, sulfuric acid, persulfuric acid, peroxodisulfuric acid, hypochlorous acid, chlorous acid, chloric acid, perchloric acid, bromous acid, bromic acid, perbromic acid, hypoiodous acid, iodous acid, iodic acid, periodic acid, salts of these acids, and ions produced by dissociation of these salts; and also hydrogen peroxide, ozone, fluorine, chlorine, bromine, iodine, permanganate salts, chromates, dichromates, and cerium salts. The oxidizing agent of these can be used alone, or a plurality of them can be used in combination. When the oxidizing agent is added to the treatment liquid according to an embodiment of the present invention, the form of the oxidizing agent, solid, liquid, or gas, can be selected according to the properties of the oxidizing agent to be used.

Among the above, in terms of stable presence even under alkaline conditions, the oxidizing agent is more preferably hypochlorous acid, chlorous acid, chloric acid, perchloric acid, bromous acid, bromic acid, perbromic acid, hypoiodous acid, iodous acid, iodic acid, periodic acid, salts of these, ions produced by dissociation of salts of these, ozone, or hydrogen peroxide; more preferably hypochlorous acid. chlorous acid, chloric acid, perchloric acid, bromous acid, bromic acid, perbromic acid, salts of these, ions produced by dissociation of salts of these, ozone, or hydrogen peroxide; even more preferably a hypochlorite ion or ozone, and, most preferably a hypochlorite ion.

A hypochlorite ion and ozone are capable of reoxidizing bromide ion to a hypobromite ion in an alkaline treatment liquid (having a pH from 8 to 14). This is understandable also from the following. Namely, the oxidation-reduction potential of a hypochlorite ion/chloride ion system is 0.89 V, and the oxidation-reduction potential of an ozone/oxygen system is 1.24 V, whereas the oxidation-reduction potential of the hypobromite ion/bromide ion system is 0.76 V. The oxidation-reduction potentials above are values for a standard hydrogen electrode at pH 14 (25° C.).

When hypochlorous acid, a tetraalkylammonium hypochlorite, which is a salt of hypochlorous acid, or ozone is used as the oxidizing agent, the amount of metal can be substantially controlled, and thus such an oxidizing agent is suitable as the treatment liquid for semiconductor manufacturing. Among these, a tetraalkylammonium hypochlorite is stably present even in an alkali and can efficiently oxidize the bromide ion and/or the bromine-containing compound, and thus is particularly suitable.

The concentration of the oxidizing agent is not particularly limited, and the oxidizing agent can be added in an amount that enables oxidation of the bromide ion and/or the bromine-containing compound to a chemical species that is effective for etching the ruthenium.

The added amount of the oxidizing agent is preferably 21 µmol/L or more and 2.0 mol/L or less. When the added amount of the oxidizing agent is less than 21 µmol/L, the oxidizing agent cannot efficiently oxidize the bromide ion and/or the bromine-containing compound, and the etching rate of the ruthenium decreases. That is, a composition in which the oxidizing agent is not mixed has a low etching rate. On the other hand, when the added amount of the oxidizing agent is greater than 2.0 mol/L, the stability of the oxidizing agent decreases, and thus such an added amount is not appropriate. From the perspective of stabilizing the etching rate of the ruthenium over a long period of time, the concentration of the oxidizing agent is more preferably 21 µmol/L or more and 2.0 mol/L or less, and most preferably 100 µmol/L or more and 1.0 mol/L or less.

(D) Bromide Ion

The bromide ion used in the present invention is added to the treatment liquid for the purpose of improving the stability of the treatment liquid.

Any solution containing a bromide salt or a bromide ion can be used to provide the bromide ion without particular limitation. In the present invention, examples of the bromide ion that can be suitably used include tetraalkylammonium bromide, hydrobromic acid, sodium bromide, potassium bromide, calcium bromide, and magnesium bromide, and tetraalkylammonium bromide or hydrobromic acid is more preferable.

In the treatment liquid according to an embodiment of the present invention, the concentration range of the bromide ion is preferably 0.001 mol/L or more and 2.0 mol/L or less. When the concentration of the bromide ion satisfies this range, the life of the treatment liquid can be extended. As a result, a treatment liquid having excellent long-term storage stability and that can be used to stably implement etching can be obtained. In order to better exhibit this effect, the concentration of the bromide ion is more preferably 0.001 mol/L or more and 1.5 mol/L or less, even more preferably 0.005 mol/L or more and 1.0 mol/L or less, and particularly preferably 0.01 mol/L or more and 0.5 mol/L or less.

The concentration of the etching component in the treatment liquid of the present invention can be maintained at a constant level by adding bromide ions to the treatment liquid, and the stability of the treatment liquid can be improved. The mechanism for improving this stability is not necessarily clear, but is considered to be as follows. That is, when the hypobromite ions in the treatment liquid are decomposed in a disproportionation reaction, bromide ions are produced as one of the decomposition products, and thus the rate of the disproportionation reaction of the hypobromite ions can be reduced by adding a bromide ion in advance. Through this, the change in the concentration of the hypobromite ion, which is a chemical specie that etches the ruthenium, is reduced, and the etching rate of the ruthenium becomes stable, and in addition, the storage stability of the treatment liquid is improved, and the liquid life of the treatment liquid can be extended.

(E) Bromite Ion and Bromate Ion

The total concentration range of bromite ion and bromate ion used in the present invention is preferably from $3.3 \times 10^{-6}$ mol/L or more and $5.0 \times 10^{-1}$ mol/L or less. The bromite ion and bromate ion can be added to the treatment liquid for the purpose of improving the stability of the treatment liquid. As the bromite ion used in the present invention, a commercially available bromite salt can be used, or a bromite ions produced using a disproportionation reaction of hypobromite ions can be used. To obtain a bromite salt free from metal impurities, a sodium bromite solution prepared through a disproportionation reaction of sodium hypobromite is passed through an ion-exchange resin substituted with tetramethylammonium ions, and thereby a tetramethylammonium bromite solution is purified and can then be used. Furthermore, any solution containing a bromate salt or bromic acid can be used to provide the bromate ions without particular limitation. In the present invention, examples of bromate ion that can be suitably used include sodium bromate, potassium bromate, and tetraalkylammonium bromate, and tetramethylammonium bromate is more preferable.

The concentration of the etching component in the treatment liquid of the present invention can be maintained at a constant level by adding a bromite ion and/or a bromate ion to the treatment liquid, and the stability of the treatment liquid can be improved. The mechanism for improving this stability is not necessarily clear, but is considered to be as follows. That is, when the hypobromite ion in the treatment liquid is decomposed in a disproportionation reaction, bromite ion and/or bromate ion is/are produced as decomposition products, and thus the rate of the disproportionation reaction of the hypobromite ions can be reduced by adding these ions in advance. Through this, the change in the concentration of the hypobromite ion, which is a chemical specie that etches the ruthenium, is reduced, and the etching rate of the ruthenium becomes stable, and in addition, the storage stability of the treatment liquid is improved, and the liquid life of the treatment liquid can be extended.

(F) Chlorite Ion, Chlorate Ion, Chloride Ion, and Sulfate Ion

The total concentration range of a chlorite ion, a chlorate ion, a chloride ion, and a sulfate ion used in the present invention is preferably 10 μmol/L or more and 2.0 mol/L or less. Chlorite ions, chlorate ions, chloride ions, and sulfate ions can be added to the treatment liquid for the purpose of improving the stability of the treatment liquid. In the present invention, any solution containing a chlorite salt or chlorous acid can be used to provide the chlorite ions without particular limitation. In the present invention, examples of chlorite ions that can be suitably used include sodium chlorite, potassium chlorite, and tetraalkylammonium chlorite, and tetramethylammonium chlorite is more preferable. Furthermore, any solution containing a chlorate salt or chloric acid can be used to provide the chlorate ions without particular limitation. In the present invention, examples of chlorate ions that can be suitably used include sodium chlorate, potassium chlorate, and tetraalkylammonium chlorate, and tetramethylammonium chlorate is more preferable. Furthermore, any solution containing a chloride salt or hydrochloric acid can be used to provide the chloride ions without particular limitation. In the present invention, examples of chloride ions that can be suitably used include hydrochloric acid, sodium chloride, potassium chloride, and tetraalkylammonium chloride, and hydrochloric acid and tetramethylammonium chloride are more preferable. Furthermore, any solution containing a sulfate salt or sulfuric acid can be used to provide the sulfate ions without particular limitation. In the present invention, examples of sulfate ions that can be suitably used include sulfuric acid, sodium sulfate, sodium hydrogen sulfate, potassium sulfate, potassium hydrogen sulfate, barium sulfate, and strontium sulfate, and sulfuric acid and tetramethylammonium sulfate are more preferable. The concentration of the etching component in the treatment liquid of the present invention can be maintained at a constant level by adding one or more ions selected from the group consisting of chlorite ion, chlorate ion, chloride ion, and sulfate ion to the treatment liquid, and the stability of the treatment liquid can be improved. The mechanism for improving this stability is not necessarily clear, but is considered to be as follows. That is, when the hypobromite ion in the treatment liquid is decomposed in a disproportionation reaction, bromite ion and/or bromate ion and/or bromide ion are produced as decomposition products, and thus it is contemplated that the rate of the disproportionation reaction of the hypobromite ion can be reduced by adding, in advance, one or more ions selected from the group consisting of a chlorite ion, a chlorate ion, and a chloride ion. That is, chlorite ion, chlorate ion, and chloride ion exhibit similar effects as the bromite ion, bromate ion, and bromide ion described above. Through this, the change in the concentration of the hypobromite ion, which is a chemical specie that etches the ruthenium, is reduced, and the etching rate of the ruthenium becomes stable, and in addition, the storage stability of the treatment liquid is improved, and the liquid life of the treatment liquid can be extended.

The treatment liquid of the present invention may contain a metal (or a metal ion, hereinafter referred to as a metal even in a case of a metal ion) in the production of the treatment liquid. Specific examples of the contained metal include lithium, sodium, potassium, aluminum, magnesium, calcium, chromium, manganese, iron, nickel, cobalt, copper, silver, cadmium, barium, zinc, and lead, and ions of these metals. When left on a semiconductor wafer, these metals have an adverse effect on the semiconductor wafer (adverse effect such as reducing the yield of semiconductor wafers). Therefore, it is preferable that the content of metal in the treatment liquid is small, but by containing a small amount of metal in the treatment liquid, the flatness of the metal surface after the etching treatment can be maintained (surface roughness can be prevented). From this, as the content of metal in the treatment liquid, the content based on mass of any one metal selected from the group consisting of lithium, sodium, potassium, aluminum, magnesium, calcium, chromium, manganese, iron, nickel, cobalt, copper, silver, cadmium, barium, zinc, and lead is preferably 0.01 ppt or more and 1 ppb or less, more preferably 1 ppt or more and 1 ppb or less, even more preferably 10 ppt or more and 500 ppt or less, and most preferably 100 ppt or more and 200 ppt or less.

In a case in which the content of the metal exceeds 1 ppb, the metal content can be reduced to 1 ppb or less through measures such as filtration, distillation, or ion exchange.

Storage Stability of Treatment Liquid

While the conditions during storage of the treatment liquid of the present invention are not particularly limited, the treatment liquid is preferably stored under general storage conditions, namely, at a temperature from −25 to 50° C. in a known container, canister, or storage container made from resin, and is more preferably stored in a dark place at a temperature from −20 to 40° C. in a transport container that can block light, such as a storage container or canister, or in a storage container made from resin, with the container or canister being filled with an inert gas. If the storage temperature exceeds the range described above, water content volatilizes during long-term storage, and this may cause the container to expand and be damaged.

In a case in which the treatment liquid of the present invention includes at least one of ions selected from the group consisting of a bromide ion, a bromite ion, a bromate ion, a chlorite ion, a chlorate ion, a chloride ion, and a sulfate ion, the rate of the disproportionation reaction of the hypobromite ion decreases, and therefore the change in concentration of the hypobromite ion can be further reduced. Thus, even after storage, the treatment liquid of the present invention containing these anions can be used without significantly changing the etching rate, and etching can be stably implemented.

According to the storage method of the present invention, almost no change occurs in the oxidizing power during storage of the treatment liquid containing a hypobromite ion, even with a storage period of three days, and preferably seven days. Thus, after storage, the treatment liquid can be used in a variety of applications. An effect of improving productivity can be anticipated as the storage period is lengthened.

Solvent

The remaining portion of the treatment liquid of the present invention, besides the components (A), (B), (C), (D), (E), and (F), the bromine-containing compound, the oxidizing agent, the pH adjusting agent, and other additives to be described later, is a solvent. The components (A), (B), (C), (D), (E), and (F), the bromine-containing compound, the oxidizing agent, the pH adjusting agent, and other additives are adjusted, and the remaining portion can be adjusted with a solvent so as to achieve the concentration of each component.

In the present invention, the solvent is not particularly limited, and an organic solvent, water, or the like can be used. Furthermore, the solvent can be a mixture of water and an organic solvent. When an organic solvent is used, an organic solvent that is stably present even in the presence of hypobromite ion present in the treatment liquid is preferable, and examples thereof include acetonitrile and sulfolane. Also, when water is used, preferably metal ions, organic impurities, particulate particles, or the like have been removed by a treatment such as distillation, ion exchange, filtration, or various types of adsorption, and pure water and ultrapure water are particularly preferable. Such water can be easily prepared by a method for producing ultrapure water, the method thereof being widely used in semiconductor manufacturing.

pH of Treatment Liquid

The pH of the treatment liquid according to the present invention is preferably 8 or higher and 14 or less. When the of the treatment liquid of the present invention is 14 or less, the of the treatment liquid does not vary significantly even if ruthenium is oxidized, dissolved, and removed, and fluctuations in the concentration of the hypobromite ions can be reduced. Therefore, fluctuations in the etching rate of the ruthenium can also be reduced, and the ruthenium can be stably etched. If the pH of the treatment liquid is higher than 14, the etching rate of the ruthenium is significantly reduced. If the pH is less than 8, a decomposition reaction of the hypobromite ions contained in the treatment liquid tends to easily occur. Therefore, in consideration of the etching rate and highly accurate control of the etching rate, the pH of the treatment liquid is preferably 8 or higher and 14 or less, more preferably 12 or higher and 14 or less, and even more preferably 12 or higher and less than 13. In a case in which boric acid is used as the pH buffer, for example, the preferable upper limit of the pH of the treatment liquid is less than 10.

Other Additives

Other additive that have been used in semiconductor treatment liquids can be blended, as desired, into the treatment liquid of the present invention in a range that does not impair the object of the present invention. Examples of the additives include acids, alkalis, metal corrosion inhibitors, water-soluble organic solvents, fluorine compounds, oxidizing agents, reducing agents, chelating agents, surfactants, and antifoaming agents.

Ruthenium Etching Method

Ruthenium present on the semiconductor wafer can be suitably etched using the treatment liquid of the present invention. The treatment of a wafer containing ruthenium with the treatment liquid of the present invention can be a single wafer treatment or an immersion treatment. Furthermore, the method for treating the semiconductor wafer with the treatment liquid of the present invention is not limited to wet etching, and the treatment liquid of the present invention can also be suitably used as a treatment liquid in a washing application or a residue removal application, or as a component of a slurry for chemical mechanical planarization (CMP).

The conditions for using the treatment liquid of the present invention can be appropriately determined according to the etching conditions of the etching apparatus or the like to be used, For example, the treatment temperature can be from 10 to 80° C., and is more preferably in a range from 20 to 70° C.

The treatment time when a wafer is to be treated using the treatment liquid of the present invention is in a range from 0.1 to 120 minutes and preferably from 0.5 to 60 minutes, and is appropriately determined according to etching conditions and the semiconductor element to be used. An organic solvent, such as an alcohol, can be used as a rinse solution after using the treatment liquid of the present invention, but simply rinsing with deionized water is sufficient.

As described above, the treatment quid of the present invention enables an etching rate of precious metals, particularly ruthenium, to be set to 20 Å/min or higher, and preferably 50 Å/min or higher, and reduces fluctuations in the pH, and thereby, for example, the variation percentage in the etching rate of ruthenium can be reduced to 30% or less even when the pH is varied due to disturbance. As clear from this, the treatment liquid of the present invention can be suitably used for etching ruthenium when ruthenium is used in a semiconductor element formation process.

The treatment liquid of the present invention also bas a function of reducing the generation of $RuO_4$ gas. The mechanism is speculated to be as follows. That is, anions such as $RuO_4^-$ and $RuO_4^{2-}$ (may be described hereinafter as $RuO_4^-$, etc.) produced through the dissolution of ruthenium in an alkaline treatment liquid electrostatically interact with the onium ion (C) contained in the treatment liquid, and a some of the interacted ions becomes stably present as ion pairs. Thus, a conversion from $RuO_4^-$, etc. to $RuO_4$ is hindered, and as a result, the generation of $RuO_4$ gas is suppressed. Further, because the generation of $RuO_4$ is suppressed, it is assumed that the generation of $RuO_2$ particles produced by the reduction of $RuO_4$ is also suppressed. The production of $RuO_4$ and $RuO_2$ depends on the pH, and therefore the pH of the treatment liquid containing ruthenium preferably does not fluctuate. Fluctuations in the pH of the treatment liquid reduced by a pH buffer contained in the treatment liquid, and the production of $RuO_4$ and $RuO_2$ can be reduced.

From the perspective of the generation of $RuO_4$ and $RuO_2$, an oxidizing agent that can etch the ruthenium in an alkaline range with a pH from 8 to 12 is preferable, and from the perspective of the etching rate of ruthenium being higher in the alkaline range, hypobromite ion is more excellent than hypochlorite ion, ortho-periodate ion, and meta-periodate ion.

In the treatment liquid of the present invention, the $RuO_4$ gas generation reduction effect from the addition of onium ions represented by formulas (1) to (4) is not limited by, for example, the type and concentration of the hypobromite ion, pH buffer, oxidizing agent besides the hypobromite ion, and other additives contained in the treatment liquid, or by the treatment method and treatment conditions. For example, the $RuO_4$ gas generation reduction effect is brought by onium ions represented by formulas (1) to (4) and contained in the treatment liquid of the present invention regardless of the concentration of the hypobromite ion in the treatment liquid. In addition, the temperature of the treatment liquid is not particularly limited, and the $RuO_4$ gas generation reduction effect is exhibited at any treatment temperature by onium ions represented by formulas (1) to (4) and contained in the treatment liquid. The $RuO_4$ gas generation reduction effect of the treatment liquid of the present invention is not limited to a case of use in wet etching, and the effect is exhibited even when the treatment liquid is used in a washing application or a residue removal application, or as a component of a slurry for CMP. For example, when the treatment liquid of the present invention is used for CMP polishing, the generation of $RuO_4$ gas can be suppressed even in the CMP polishing process.

Inhibitor for Ruthenium-Containing Gas Generation

An inhibitor for generation of ruthenium-containing gas (RuO4 -containing gas) refers to a liquid that contains (A) a hypobromite ion, (B) a pH buffer, and (C) an onium ion, and inhibits the generation of ruthenium-containing gas when added to a liquid for treating the ruthenium. The pH buffer can be any pH buffer as long as it has a pH buffering capacity, but a pH buffer used in the semiconductor treatment liquid of the present invention can be suitably used. Furthermore, the onium ion is preferably onium ion represented by any of formulas (1) to (4). The inhibitor for ruthenium-containing gas generation can further contain (D) a bromide ion, can further contain (E) a bromite ion and/or bromate ion, and can contain (F) one or more chlorine-containing ions selected from the group consisting of a chlorite ion, a chlorate ion, and a chloride ion.

The liquid for treating ruthenium can be any liquid as long as the liquid contains a component that imparts physical and chemical changes to ruthenium when in contact with ruthenium, and examples of the liquid include a solution containing an oxidizing agent. Examples of the oxidizing agent include oxidizing agents like those exemplified in the description above and a hypobromite ion. All or some of the ruthenium treated by the liquid for treating ruthenium is dissolved, dispersed, or precipitated in the treatment liquid, and causes the generation of $RuO_4$, (gas) and/or $RuO_2$ (particles). The generation of $RuO_4$ (solution) and $RuO_2$ (particles) depends on the pH, and therefore the pH of the treatment liquid containing ruthenium preferably does not fluctuate, Fluctuations in the pH of the ruthenium treatment liquid containing an inhibitor for ruthenium-containing gas generation can be reduced by a pH buffer contained in the inhibitor for ruthenium-containing gas generation. Through this, the generation of $RuO_4^-$ containing gas from the liquid for treating ruthenium is suppressed. As the pH buffer, any pH buffer like those exemplified in the above description can be used without limitation. With a liquid (may also be referred to as a treatment liquid containing an inhibitor for gas-generation) containing the liquid for treating ruthenium and the ruthenium-containing inhibitor for gas generation of the present invention, the $RuO_4^-$, etc., and the onium ion present in the treatment liquid form ion pairs that dissolve in the treatment liquid, and thereby the generation of $RuO_4$ gas and $RuO_2$ (particles) is suppressed.

With respect to the inhibitor for ruthenium-containing gas generation, conditions such as the content of the hypobromite ion, the type and content of the pH buffer, the type and content of the onium ion, the other components, the content of the other components, and the pH, can be appropriately set so as to suppress the generation of ruthenium-containing gas from the treatment liquid containing the inhibitor for gas generation, and for example, the same conditions as those described in the description of the semiconductor treatment liquid can be applied.

As an example, the concentration of the hypobromite ion contained in the inhibitor for ruthenium-containing gas generation is preferably from 0.001 mol/L to 0.20 mol/L as an amount of the bromine element contained in the hypobromite ion.

Moreover, boric acid, carbonic acid, or phosphoric acid is preferably contained as the pH buffer. In particular, a desirable pH buffering capacity can be anticipated when the pH of the treatment liquid containing the inhibitor for gas generation is from 8.2 to 10.2 in a case in which boric acid is used, when the pH of the treatment liquid containing the inhibitor for gas generation is from 9.3 to 11.3 in a case in which carbonic acid is used, and when the pH of the treatment liquid containing the inhibitor for gas generation is from 11.4 to 13.4 in a case in which phosphoric acid is used. The pH buffer of these can be used alone, or a plurality of these pH buffers can be used in combination.

In addition, the concentration of the pH buffer contained in the inhibitor for ruthenium-containing gas generation is preferably from 0.0001 to 1.0 mol/L and more preferably from 0.01 to 0.8 mol/L, of the inhibitor for ruthenium-containing gas generation. When the concentration of the pH buffer is in the range from 0.001 to 0.8 mol/L, fluctuations in the pH of the treatment liquid containing the inhibitor for gas generation is reduced, and a sufficient effect of inhibiting the generation of ruthenium-containing gas is achieved.

Furthermore, in addition to the above conditions, for example, the content of the onium ion represented by formulas (1) to (4) above and contained in the inhibitor for ruthenium-containing gas generation is preferably from 0.000001 to 5.0 mol/L, more preferably from 0.00001 to 3.0 mol/L, and even more preferably from 0.00001 to 2.0 mol/L.

In addition, the same pH adjusting agent as that described above can be added, as appropriate, to the inhibitor for ruthenium-containing gas generation. The content of the pH adjusting agent can be adjusted such that the pH of the treatment liquid containing the inhibitor for gas generation is within a predetermined range. For example, the content of the pH adjusting agent in the inhibitor for ruthenium-containing gas generation need only be an effective amount, and specifically, can be, for example, from 0.000001 to 1.0 mol/L. The pH of the treatment liquid containing the inhibitor for gas generation is preferably 8 or higher and 14 or less.

As described above, the treatment liquid of the present invention contains a hypobromite ion, an onium ion, and a pH buffer, and therefore can treat a semiconductor wafer that contains ruthenium without generating $RuO_4$ gas. Thus, the treatment liquid of the present invention is a liquid for treating ruthenium, and at the same time, is also an inhibitor that suppresses the generation of ruthenium-containing gas.

Method for Inhibiting Generation of Ruthenium-Containing Gas

A method for inhibiting the generation of ruthenium-containing gas of the present invention includes adding the inhibitor for ruthenium-containing gas generation described above to the liquid for treating ruthenium. Specifically, for example, the generation of the ruthenium-containing gas can be suppressed by adding the inhibitor for ruthenium-containing gas generation of the present invention to liquids (these liquids correspond to the liquid for treating ruthenium) used in processes in which ruthenium is treated, such as an etching process, a residue removal process, a washing process, and a CMP process, in manufacturing a semiconductor. In addition, the generation of ruthenium-containing gas can be suppressed by using a liquid containing the inhibitor for ruthenium-containing gas generation in washing ruthenium adhered to a chamber inner wall, piping, or the like in various devices used in these processes in manufacturing semiconductor. For example, in the maintenance of a device that forms ruthenium using physical vapor deposition (PVD) or chemical vapor deposition (CVD), the inhibitor for ruthenium-containing gas generation of the present invention can be added to a washing solution that is used in removing ruthenium adhered to the chamber, piping, or the like, and thereby ruthenium-containing gas generated during washing can be suppressed. According to the method described above, the generation of ruthenium-containing gas can be suppressed by the mechanism described above.

Note that in the method for inhibiting the generation of a ruthenium-containing gas, it is preferable to adjust the concentration and addition amount of onium ions in the inhibitor for ruthenium-containing gas generation such that concentrations of both the pH buffer and the onium ions in a mixed solution of the inhibitor for ruthenium-containing gas generation and the liquid for treating the ruthenium are from 10 µmol/L to 5.0 mol/L.

In addition, with respect to the inhibitor for ruthenium-containing gas generation, the same pH adjusting agent as that described above can be added, as appropriate, to the inhibitor for ruthenium-containing gas generation. The amount of the pH adjusting agent contained in the inhibitor for ruthenium-containing gas generation can be adjusted, as appropriate, such that the pH of the mixed solution obtained when the liquid for treating ruthenium and the inhibitor for ruthenium-containing gas generation are mixed is, for example, from 8 to 14. The amount of the inhibitor for ruthenium-containing gas generation that is added to the liquid for treating ruthenium can be adjusted, as appropriate, such that the pH of the mixed solution when both liquids are mixed is, for example, 8 or higher and 14 or less.

The amount of the inhibitor for ruthenium-containing gas generation added to the liquid for treating ruthenium depends on the amount of ruthenium dissolved in the treatment liquid containing the inhibitor for gas generation. The added amount of the inhibitor for ruthenium-containing gas generation is not particularly limited, but, for example, in terms of a weight ratio when the amount of ruthenium that dissolves in the liquid for treating ruthenium is considered to be 1, the added amount of the inhibitor for ruthenium-containing gas generation is preferably from 10 to 500000, more preferably from 100 to 100000, and even more preferably from 1000 to 50000. The inhibitor for ruthenium-containing gas generation and the liquid for treating the ruthenium can be mixed at any time, but when these liquids are mixed before treating the ruthenium with the liquid for treating ruthenium, the generation of the ruthenium-containing gas can be suppressed, and thus mixing at such time is more preferable.

Treatment Agent for Ruthenium-Containing Waste Liquid

A treatment agent for ruthenium-containing waste liquid refers to a liquid that contains a hypobromite ion, a pH buffer, and an onium ion and suppresses the generation of ruthenium-containing gas when added to a ruthenium-containing waste liquid. The pH buffer can be any pH buffer as long as it has a pH buffering capacity, but a pH buffer used in the semiconductor treatment liquid of the present invention can be suitably used. Furthermore, the onium ion is preferably onium ion represented by any of formulas (1) to (4) above. The treatment agent for a ruthenium-containing waste liquid can further contain (D) a bromide ion, can further contain (E) a bromite ion and/or bromate ion, and can include (F) one or more ions selected from the group consisting of a chlorite ion, a chlorate ion, a chloride ion, and a sulfate ion. The semiconductor treatment liquid and the inhibitor for $RuO_4$-containing gas generation of the present invention are liquids containing a hypobromite ion, a pH buffer, and an onium ion, and thus can also be used as a treatment agent for a ruthenium-containing waste liquid of the present invention.

Here, the ruthenium-containing waste liquid means a solution containing even a small amount of ruthenium. Here, ruthenium is not limited to a ruthenium metal, and can be any form containing the ruthenium element, such as, for example, Ru, $RuO_4^-$, $RuO_4^{2-}$, $RuO_4$, and $RuO_2$. Examples of the ruthenium-containing waste liquid can include a liquid remaining after the etching treatment of a semiconductor wafer containing ruthenium has been implemented using a treatment liquid separate from the treatment liquid of the present invention, or a liquid remaining after treatment has been implemented using the semiconductor wafer treatment liquid of the present invention. Also, the ruthenium-containing waste liquid is not limited to a waste liquid from semiconductor wafer etching, and another example includes a ruthenium-containing liquid generated in the semiconductor manufacturing processes, through chamber washing, or the like as described with regard to the method for inhibiting the generation of ruthenium-containing gas described above.

When ruthenium is contained in even trace amounts in a waste liquid, $RuO_2$ particles are generated through $RuO_4$ gas, and therefore the tank and pipes become contaminated, and degradation of devices is accelerated due to the oxidation effect of the particles. Furthermore, the $RuO_4$ gas generated from the waste liquid is highly toxic to the human body even at low concentrations. Thus, the ruthenium-containing waste liquid has a variety of adverse effects on devices and the human body, and therefore it is necessary to quickly treat the ruthenium-containing waste liquid to suppress the generation of $RuO_4$ gas.

However, fluctuations in the pH of the ruthenium-containing waste liquid and an increase in $RuO_4$ gas or $RuO_2$ particles can be reduced by adding the treatment agent of the present invention for treating ruthenium-containing waste liquid to the ruthenium-containing waste liquid. For example, if the ruthenium-containing waste liquid is alkaline, the pH of the ruthenium-containing waste liquid is reduced due to the incorporation of carbon dioxide, acid, or the like, and $RuO_4$ gas or $RuO_2$ particles increase. However, when the treatment agent of the present invention for treating ruthenium-containing waste liquid is added to the ruthenium-containing waste liquid, the fluctuations in pH are reduced, and therefore the generation amount of $RuO_4$ gas or $RuO_2$ particles can be reduced to a low level. Further, the onium ions contained in the treatment agent for treating a ruthenium-containing waste liquid and the $RuO_4^-$, or the like contained in the ruthenium-containing waste liquid form ion pairs that dissolve in the waste liquid, and thereby the generation of $RuO_4$ gas or $RuO_2$ (particles) is suppressed.

With respect to the treatment agent of the present invention for treating ruthenium-containing waste liquid, conditions such as the content of the hypobromite ion, the type and content of the pH buffer, the type and content of the onium ion, the other components, the content of the other components, and the pH, can be appropriately set so as to suppress the generation of ruthenium-containing gas from the ruthenium-containing waste liquid, and for example, the same conditions as those described in the description of the semiconductor treatment liquid can be applied.

Furthermore, in addition to these conditions, for example, the content of onium ion represented by formulas (1) to (4) above in the treatment agent for a ruthenium-containing waste liquid can be from 10 μmol/L to 5.0 mol/L. This concentration can be adjusted such that the concentration of onium ion of the above formulas (1) to (4) becomes a predetermined concentration in a mixed solution when the treatment agent is mixed with the ruthenium-containing waste liquid. In addition, the same pH adjusting agent as that described above can be added, as appropriate, to the treatment agent for the ruthenium-containing waste liquid. The content of the pH adjusting agent can be adjusted such that the pH of the mixed solution when the treatment agent is mixed with the ruthenium-containing waste liquid is within a predetermined range. For example, the content of the pH adjusting agent in the treatment agent for a ruthenium-containing waste liquid need only be an effective amount, and specifically, can be, for example, from 0.000001 to 1.0 mol/L.

Moreover, boric acid, carbonic acid, or phosphoric acid is preferably contained as the pH buffer. In particular, a desirable pH buffering capacity can be anticipated when the pH of the treatment liquid for the ruthenium-containing waste liquid is from 8.2 to 10.2 in a case in which boric acid is used, when the pH of the treatment liquid for the ruthenium-containing waste liquid is from 9.3 to 11.3 in a case in which carbonic acid is used, and when the pH of the treatment liquid for the ruthenium-containing waste liquid is from 11.4 to 13.4 in a case in which phosphoric acid is used. The pH buffer of these can be used alone, or a plurality of these pH buffers can be used in combination. Furthermore, the concentration of each pH buffer in the treatment agent for ruthenium-containing waste liquid is preferably from 0.0001 to 1.0 mol/L, more preferably from 0.0001 to 0.8 mol/L, and even more preferably from 0.001 to 0.6 mol/L. When the concentration of the pH buffer is in the range from 0.001 to 0.6 mol/L, fluctuations in the pH of the treatment agent for a ruthenium-containing waste liquid are reduced, and a sufficient effect of suppressing the generation of ruthenium-containing gas is obtained.

Treatment Method for Ruthenium-Containing Waste Liquid

A treatment method for a ruthenium-containing waste liquid of the present invention includes adding the treatment agent for a ruthenium-containing waste liquid described above to a ruthenium-containing waste liquid. According to the method, ruthenium-containing gas generated from the ruthenium-containing waste liquid can be suppressed by the mechanism presented in the description of the inhibitor for ruthenium-containing gas generation described above. Therefore, not only is handling of ruthenium-containing waste liquid facilitated, but exhaust equipment and removal equipment can be simplified, and the cost for treating ruthenium-containing gas can be reduced. Furthermore, the risk of a worker being exposed to a highly toxic ruthenium-containing gas is reduced, and safety is significantly improved.

Note that in the method of treating the ruthenium-containing waste liquid, it is preferable to adjust the concentrations and addition amounts of the onium ion represented by formulas (1) to (4) and of the pH buffer contained in the treatment agent for the ruthenium-containing waste liquid such that the concentrations of both the pH buffer and the onium ion represented by formulas (1) to (4) in a mixed solution of the treatment agent for a ruthenium-containing waste liquid and the ruthenium-containing waste liquid are from 10 μmol/L to 5.0 mol/L.

In addition, with respect to the method of treating the ruthenium-containing waste liquid, the same pH adjusting agent as that described above can be added, as appropriate, to the treatment agent for the ruthenium-containing waste liquid. The amount of the pH adjusting agent contained in the treatment agent for the ruthenium-containing waste liquid can be adjusted, as appropriate, such that the pH of the mixed solution when the treatment agent for the ruthenium-containing waste liquid and the ruthenium-containing waste liquid are mixed is, for example, 8 or higher and 14 or less. Furthermore, the amount of the treatment agent added to a ruthenium-containing waste liquid to treat the ruthenium-containing waste liquid can be adjusted, as appropriate, such that the pH of the mixed solution when both liquids are mixed is, for example, or higher 8 and 14 or less.

The amount of the treatment agent added to a ruthenium-containing waste liquid to treat the ruthenium-containing waste liquid depends on the amount of ruthenium in the ruthenium-containing waste liquid, and is not particularly limited. However, for example, in terms of a weight ratio when the amount of ruthenium in the ruthenium-containing waste liquid is considered to be 1, the added amount of the treatment agent is preferably from 10 to 500000, more preferably from 100 to 100000, and even more preferably from 1000 to 50000.

EXAMPLES

The present invention will be described more specifically below by examples, but the present invention is not limited to these examples.

pH Measurement Method

In Examples 1 to 68 and Comparative Examples 1 to 11, 30 mL of a treatment liquid was prepared, after which the pH was measured using a tabletop pH meter (LAQUA F-73, available from Horiba, Ltd.). The pH was measured after the treatment liquid was stabilized at a temperature of 25° C.

Method for Calculating Hypobromite Ions, Bromite Ion, and Hypochlorite Ion Concentrations The hypobromite ion, bromite ion, and hypochlorite ion concentrations of Examples 1 to 68 and Comparative Examples 1 to 11 were measured using an ultraviolet-visible spectrophotometer (UV-2600, available from Shimadzu Corporation). A calibration curve was created using an aqueous solution of hypobromite ions, bromite ions, and hypochlorite ions with known concentrations, and the hypobromite ion, bromite ion, and hypochlorite ion concentrations in the produced treatment liquid were determined. The hypobromite ion, bromite ion, and hypochlorite ion concentrations were determined from measurement data when the absorption spectrum was stabilized, and the spectrum was divided as necessary.

Method for Calculating Bromide Ion, Bromate Ion, Chlorite Ion, Chlorate Ion, and Sulfate Ion Concentrations The bromide ion, bromate ion, chlorite ion, chlorate ion, and sulfate ion concentrations in the treatment liquids of Examples 1 to 68 and Comparative Examples 1 to 11 were analyzed using an ion chromatography analyzer (Dionex Integrion HPLC, available from Thermo Fisher Scientific Inc.). KOH was used as the eluent and was fed at a flow rate of 1.2 mL/min. The column temperature was set to 30° C. Background noise was removed using a suppressor, after which concentration of the bromide ions, the bromate ions, the chlorite ions, the chlorate ions, and the sulfate ions were quantitatively determined using an electrical conductivity detector.

Method for Calculating Chloride Ion Concentration

After the treatment liquids of Examples 1 to 68 and Comparative Examples 1 to 11 were prepared, 0.5 mL of each treatment liquid was fractioned into a respective 100 mL Erlenmeyer flask. Subsequently, approximately 50 mL of ultrapure water was added, after which 5 mL of a 34 mass % hydrogen peroxide solution (special grade chemical, available from Fujifilm Wako Pure Chemical Corp.) was also added. An electrode (GE-101 B/AGR-811) attached to an automatic titrator (Hiranuma Automatic Titrator, COM Series, available from Hiranuma Sangyo Co., Ltd.) was immersed into the resultant solution, and titration with a 0.1 mol/L nitric acid standard solution was implemented to adjust the pH to a range from 2 to 3. Titration was then implemented with a 0.2 mol/L silver nitrate standard solution. The chloride ion concentration was then quantitatively determined by subtracting the concentrations of the hypobromite ions, bromite ions, bromate ions, bromide ions, hypochlorite ions, chlorite ions, and chlorate ions.

Method for Calculating Onium Ion Concentration

The onium ion concentration in each of the treatment liquids of Examples 1 to 68 and Comparative Examples 1 to 11 was determined through calculations from the pH and the concentrations of the hypobromite ions, bromite ions, bromate ions, bromide ions, hypochlorite ions, chlorite ions, chlorate ions, and chloride ions.

Method for Calculating Buffer Concentration

The buffer concentration was analyzed using the ion chromatography analyzer (Dionex Integrion HPLC, available from Thermo Fisher Scientific Inc.) KOH was used as the eluent and was fed at a flow rate of 1.2 mL/min. An anion analysis column for a hydroxide-based eluent (AS15, available from Thermo Fisher Scientific Inc.) was used as the column, and the column temperature was set to 30° C. Background noise was removed using a suppressor, after which the boric acid concentration, the carbonic acid concentration, and the phosphoric acid concentration were quantitatively determined using an electrical conductivity detector.

Method for Calculating Ruthenium Etching Rate

An oxide film was formed on a silicon wafer using a batch-type thermal oxidation furnace, and a 1200 Å (±10%) film of ruthenium was formed on the oxide film using a sputtering method. The resistance of each sheet was measured with a four-probe resistance measuring device (Loresta-GP, available from Mitsubishi Chemical Analytech Co., Ltd.) and converted to a film thickness.

Next, 40 mL of the treatment liquid of each of Examples 1 to 68 and Comparative Examples 1 to 11 was prepared in a fluororesin container with a lid (94.0 mL PFA container available from AsOne Corporation), after which the container was immersed in a water bath while being stirred at 800 rpm using a stirrer (CHPS-1.70DF, available from AsOne Corporation), and the treatment liquid was stabilized at the temperature indicated in Table 1, Table 2, or Table 4. Each sample piece measuring 10×20 mm was immersed in these respective treatment liquids for 1 minute, and a value obtained by dividing the amount of change in film thickness between before and after treatment by the immersion time was calculated as the etching rate.

pH Stability

An amount of 49.5 mL of each of the treatment liquids of Examples 1 to 68 and Comparative Examples 1 to 11 was prepared, after which 0.5 mL of 1 mass % hydrochloric acid was added to the treatment liquids of Examples 1 to 20 and 51 to 54 and Comparative Example 3, the mixtures were stirred for 5 minutes, and then the pH was measured using a tabletop pH meter. An amount of 0.5 mL of 5 mass % hydrochloric acid was added to the treatment liquids of Examples 21-50 and 55-60 and Comparative Examples 1, 2, and 4, the mixtures were stirred for 5 minutes, and then the pH was measured using a tabletop pH meter.

Etching Rate Stability after Acid Addition

The stability of the etching rate was evaluated using the treatment liquids prepared as described above. The etching rate was measured before the addition of hydrochloric acid and after the addition of hydrochloric acid. The percentage of variation in the etching rate after acid addition was determined using the following equation.
Etching rate variation (%) after acid addition=(etching rate after acid addition−etching rate before acid addition)/(etching rate before acid addition)×100

Storage Stability Evaluation Method

The storage stability of Examples 57 to 60, 67, and 68, and Comparative Example 11 was evaluated as follows. An amount of 50 mL, of the treatment liquid was transferred to a PFA bottle and stored for 7 days in an environment in which the carbon dioxide concentration of the gas phase portion was 1 ppm or less and the storage temperature was 23° C. Subsequently, the hypobromite ion concentration and pH of the treatment liquid were evaluated. The storage stability of Examples 61 to 66 and Comparative Examples 9 and 10 was evaluated as follows. An amount of 50 mL of the treatment liquid was transferred to a PFA bottle and stored for 7 days in an environment in which the carbon dioxide concentration of the gas phase portion was 1 ppm or less, and the storage temperature was 5° C. Subsequently, the hypobromite ion concentration and pH of the treatment liquid were evaluated.

Etching Rate Stability after Storage

The stability of the etching rate was evaluated using the treatment liquids stored for 7 days as described above. The etching rate was measured before and after storage for 7 days. The percentage of variation in the etching rate after storage was determined using the following equation.

Etching rate variation (%) after storage=(etching rate immediately before storage−etching rage after 7 days or storage)/(etching rate immediately before storage)×100

Quantitative Analysis of $RuO_4$ Gas

The generated amount of $RuO_4$ gas was measured using the ICP-OES. In a closed container containing an amount of 5 mL of the treatment liquid, one 10×20 mm silicon wafer on which was formed a ruthenium film having a thickness of 1200 Å was immersed in the treatment liquid for 60 minutes at the temperature shown in Table 4. The weight when all of the ruthenium was dissolved was 0.000298 g. Subsequently, air was flowed into the closed container, the gas phase in the closed container was bubbled into a container containing an absorption liquid (1 mol/L NaOH), and the $RuO_4$ gas generated during immersion was trapped in the absorption liquid. The amount of ruthenium in this absorption liquid was measured by ICP-OES, and the amount of ruthenium in the generated $RuO_4$ gas was determined. The dissolution of all of the ruthenium on the silicon wafer immersed in the treatment liquid was confirmed by measuring the resistance of each sheet before and after immersion using the four-probe resistance measuring device (Loresta-GP, available from Mitsubishi Chemical Analytech Co., Ltd.), and then converting the sheet resistance to a film thickness.

Example 1

Preparation of Sample to be Etched

A silicon wafer having a washed surface was prepared, and a thermal oxide film having a predetermined film thickness was formed thereon. A sample on which ruthenium having a film thickness of 1200 Å was laminated was prepared by forming, through sputtering, a film of ruthenium on the silicon wafer thus obtained.

Preparation of Tetramethylammonium Bromite Aqueous Solution

An aqueous solution of sodium hypobromite (Cica-grade 1, available from Kanto Chemical Co., Inc., concentration of 9% or higher) was concentrated and dried with an evaporator while being cooled to 0° C., and yellow crude crystals were formed. The formed crude crystals were recrystallized six times using a 2N sodium hydroxide solution, and yellow needle-like crystals of bromite trihydrate were formed. The crystals were vacuum dried at a pressure of approximately 5 mmHg or lower and a temperature of 20° C. or lower for 72 hours, and sodium bromite anhydride was produced.

Next, a glass column (Biocolumn CF-50TK, available from AsOne Corp.) having an inner diameter of approximately 45 mm was charged with 200 mL of a strongly acidic ion exchange resin (AmberLite IR-120BNa, available from Organo Corp.). Subsequently, 1 L of 1N hydrochloric acid (available from Fujifilm Wako Pure Chemical Corp., for volumetric analysis) was passed through the ion exchange resin column in order to replace with a hydrogen form, and 1 L of ultrapure water was passed there through to rinse the ion exchange resin.

Furthermore, 2 L of a 2.38% tetramethylammonium hydroxide solution was passed through the ion exchange resin exchanged to the hydrogen form, and ion exchange was implemented from the hydrogen form to the tetramethylammonium form. After the ion exchange, 1 L of ultrapure water was passed through the ion exchange resin to rinse the resin.

Next, 54.0 g of purified sodium bromite was placed in a fluororesin container, after which 946 g of ultrapure water was added thereto, and a 5.4 mass % (0.4 mol/L) sodium bromite aqueous solution was prepared. The prepared aqueous sodium bromite solution was passed through an ion exchange resin exchanged to a tetramethylammonium form. The Na concentration of the recovered tetramethylammonium bromite was analyzed using high-frequency inductively-coupled plasma emission spectroscopy (iCAP 6500 DuO, available from Thermo Fisher Scientific Inc.), and the sufficient implementation of ion exchange was confirmed. If ion exchange was insufficient, the above operation was repeated until a 7.4 mass % (0.40 mol/L) tetramethylammonium bromite solution having a Na concentration of 500 ppb or less was prepared.

Preparation of Tetramethylammonium Bromate Aqueous Solution

An amount of 60.4 g of sodium bromate (Wako Special Grade, available from Fujifilm Wako Pure Chemical Corp.)

was placed in a fluororesin container. 939.6 g of ultrapure water was added thereto, and an aqueous solution of 6.0 mass % (0.40 malt) sodium bromate was prepared. By the same method used in the preparation of the aqueous tetramethylammonium bromite solution, the prepared sodium bromate aqueous solution was passed through an ion exchange resin exchanged to a tetramethylammonium form. The Na concentration of the recovered tetramethylammonium bromate was analyzed using high-frequency inductively-coupled plasma emission spectroscopy (iCAP 6500 DuO, available from Thermo Fisher Scientific Inc.), and the sufficient implementation of ion exchange was confirmed. If ion exchange was insufficient, the above operation was repeated until an 8.1 mass % (0.40 mol/L) tetramethylammonium bromate solution having a Na concentration of 500 ppb or less was prepared.

Preparation of Tetramethylammonium Bromide

Tetramethylammonium bromide (available from Tokyo Chemical Industry Co., Ltd., purity of 97.0% or higher) was added to ion exchange water until saturation was reached. The saturated aqueous solution of tetramethylammonium bromide was stored in a refrigerator overnight. The precipitated tetramethylammonium bromide was collected by filtration. The collected tetramethylammonium bromide was diluted with ultrapure water and analyzed using an ion chromatography analyzer. The $CO_3^-$, $SO_4^-$, and $Cl^-$ in the diluted solution were analyzed, and a decrease in $Na_2CO_3$, $Na_2SO_4$, and NaCl contained as impurities was confirmed. The above purification operation was repeated until it was confirmed that $CO_3^-$, $SO_4^-$, and $Cl^-$ were each 500 ppb or less, and purified tetramethylammonium bromide was prepared.

Preparation of Tetramethylammonium Hypochlorite Aqueous Solution

An amount of 98.7 g of sodium hypobromite pentahydrate (Nikkei Diaso (trade name) pentahydrate, available from Nippon Light Metal Co., Ltd.) was dissolved in 901.3 g of ultrapure water, and a 4.5 mass % (0.60 mol/L) sodium hypochlorite aqueous solution was prepared. By the same method used in the preparation of the aqueous tetramethylammonium bromite solution, the prepared sodium hypochlorite aqueous solution was passed through an ion exchange resin exchanged to a tetramethylammonium form. The Na concentration of the recovered tetramethylammonium hypochlorite aqueous solution was analyzed using high-frequency inductively-coupled plasma emission spectroscopy (iCAP 6500 DuO, available from Thermo Fisher Scientific Inc.), and the sufficient implementation of ion exchange was confirmed. If ion exchange was insufficient, the above operation was repeated until a 7.5 mass % (0.60 mol/L) tetramethylammonium hypochlorite solution having a Na concentration of 500 ppb or less was prepared.

Preparation of Tetramethylammonium Chlorate Aqueous Solution

Sodium chlorate (available from Alfa Aesar) was added to ion exchange water until saturation was reached. The saturated aqueous solution of sodium chlorate was stored in a refrigerator overnight. The precipitated sodium chlorate was collected by filtration. The recovered sodium chlorate was diluted with ultrapure water and analyzed using an ion chromatography analyzer. The $CO_3^-$, $SO_4^-$, and $Cl^-$ in the diluted solution were analyzed, and a decrease in $Na_2CO_3$, $Na_2SO_4$, and NaCl included as impurities was confirmed. The above purification operation was repeated until it was confirmed that $CO_3^-$, $SO_4^-$, and $Cl^-$ were each 500 ppb or less, and sodium chlorate was purified.

Next, 11 g of the purified sodium chlorate was placed in a fluororesin container, after which 989 g of ultrapure water was added thereto, and a 1.1 mass % (0.1 mol/L) sodium chlorate aqueous solution was prepared. By the same method used in the preparation of the aqueous tetramethylammonium bromite solution, the prepared sodium chlorate aqueous solution was passed through an ion exchange resin exchanged to a tetramethylammonium form. The Na concentration of the recovered tetramethylammonium chlorate was analyzed using high-frequency inductively-coupled plasma emission spectroscopy (iCAP 6500 DuO, available from Thermo Fisher Scientific Inc.), and the sufficient implementation of ion exchange was confirmed. If ion exchange was insufficient, the above operation was repeated until a 1.6 mass % (0.1 mol/L) tetramethylammonium chlorate aqueous solution having a Na concentration of 500 ppb or less was prepared.

Preparation of Tetramethyl Ammonium Chloride

Tetramethylammonium chloride (available from Tokyo Chemical Industry Co., Ltd., purity of 98.0% or higher) was added to ion exchange water until saturation was reached. The saturated aqueous solution of tetramethylammonium chloride was stored in a refrigerator overnight. The precipitated tetramethylammonium chloride was collected by filtration. The collected tetramethylammonium chloride was diluted with ultrapure water and analyzed using an ion chromatography analyzer. The $CO_3^-$, $SO_4^-$, and $Cl^-$ in the diluted solution were analyzed, and a decrease in $Na_2CO_3$ and $Na_2SO_4$ included as impurities was confirmed. The above purification operation was repeated until it was confirmed that $CO_3^-$ and $SO_4^-$ were each 500 ppb or less, and tetramethylammonium chloride was purified.

Preparation of Quaternary Alkyl Ammonium Hypobromite Aqueous Solution

In a 2-L glass four-neck flask (available from Cosmos Bead Co., Ltd.), 7.2 g of a 25 mass % tetramethylammonium hydroxide aqueous solution and 992.8 g of ultrapure water were mixed, and a 0.18 mass % tetramethylammonium hydroxide aqueous solution with a $CO_2$ content of 0.5 ppm was prepared. The pH at this time was 12.3.

A rotor (available from As One Corporation, 30 mm in total length×8 mm in diameter) was then placed in the four-necked flask, a thermometer protecting tube (available from Cosmos Bead Co., Ltd., bottom-sealed type) and a thermometer were placed in one opening, and in another opening, the leading end of a PFA tube (F-8011-02, available from Flon Industry) connected to a nitrogen gas cylinder was installed above the liquid surface. Another opening was connected to a gas-washing bottle (gas-washing bottle, model No. 2450/500, available from As One Corporation) filled with a 5 mass % sodium hydroxide aqueous solution. The remaining one opening was connected to a PFA tube for supplying bromine using a feed pump. Nitrogen gas with a carbon dioxide concentration of less than 1 ppm was then introduced through the PFA tube at 200 ccm (25° C.) for 20 minutes to purge carbon dioxide in the gas phase. At this time, the carbon dioxide concentration in the gas phase was 1 ppm or less.

Subsequently, a magnetic stirrer (C-MAG HS10, available from As One Corporation) was placed in the bottom portion of the four-neck flask and rotated at 300 rpm to stir the contents, and while the periphery of the four-neck flask was cooled with ice water, bromine (available from Fujifilm Wako Pure Chemical Corp., specification purity of 99%) was supplied at a rate of 1.6 g/min for one minute, and a 1.6 mass % (0.01 mol/L) tetramethylammonium hypobromite aqueous solution was prepared. At this time, the solution temperature during the reaction was 11° C.

Production of Treatment Liquid

The prepared solution remaining in the four-neck flask made of glass was transferred into a glove bag so as not to come into contact with air, and after the carbon dioxide concentration in the glove bag became 1 ppm or less, the solution was transferred to a 1 L PFA container. Subsequently, 0.77 g of tetramethylammonium bromide, 5.0 g of a tetramethylammonium bromite aqueous solution, 5.0 g of a tetramethylammonium bromate aqueous solution, 16.7 g of a tetramethylammonium hypochlorite aqueous solution, 1.2 g of tetramethylammonium chloride, 3 g of a tetramethylammonium chlorate aqueous solution, and 22.3 g of boric acid (reagent special grade, available from Fujifilm Wako Pure Chemical Corp.) were dissolved in 976.2 g of the prepared solution, and a treatment liquid of the composition presented in Tables 1 to 4 was produced.

Evaluations

The pH of the produced treatment liquids, the concentrations of the hypobromite ions. bromite ions, bromate ions, bromide ions, and onium ions, and the concentration of the pH buffer were evaluated. The ruthenium etching rate, the pH after acid addition, the ruthenium etching rate after acid addition, and the etching rate variation before and after acid addition were evaluated. The results are shown in Table 5 and Table 6. Note that the effect of acid addition was evaluated from the percentage of variation in the etching rate before and after the acid addition by forcibly changing the pH of the treatment liquid to acidic by adding hydrochloric acid to the treatment liquid.

Examples 2 to 10, 51 and 52 and Comparative Examples 1 and 2

Treatment liquids of Examples 2 to 10, 51, and 52, and Comparative Examples 1 and 2 were prepared and evaluated by the same method as in Example 1 such that the pH and the concentrations of (A) the hypobromite ions, (B) the pH buffer, (C) the onium ions, (D) the bromide ions, (E) the bromite ions and bromate ions, and (F) the chlorite ions, chlorate ions, chloride ions, and hypochlorite ions were as indicated for the compositions shown in Tables 1-4.

Example 11

Preparation of Carbonic Acid Buffer

A PFA beaker containing 500 g of a 25 mass % tetramethylammonium hydroxide aqueous solution was placed in a glove bag, and the carbon dioxide concentration in the glove bag was set to 1 ppm, after which 30.7 L (when converted to 0° C.) of high-purity carbonic acid gas (available from Showa Denko Gas Products Co., Ltd., specification purity of 99.99% or higher) was supplied thereto, and the contents were sealed overnight, and thereby a carbonic acid buffer was prepared. The buffer concentration was calculated by the method described above using the ion chromatography analyzer.

Preparation of Quaternary Alkylammonium Hypobromite Solution

In a 2-L glass four-neck flask (available from Cosmos Bead Co., 22 g of a 25 mass % tetramethylammonium hydroxide aqueous solution and 978 g of ultrapure water were mixed, and a 0.55 mass % (0.06 mol/L) tetramethylammonium hydroxide aqueous solution with a $CO_2$ content of 0.5 ppm was obtained. The pH at this time was 12.8.

A rotor (available from As One Corporation, 30 mm in total length×8 mm in diameter) was then placed in the four-necked flask, a thermometer protecting tube (available from Cosmos Bead Co., Ltd., bottom-sealed type) and a thermometer were placed in one opening, and in another opening, the leading end of a PFA tube (F-8011-02, available from Flon Industry) connected to a nitrogen gas cylinder was installed above the liquid surface. Another opening was connected to a gas-washing bottle (gas-washing bottle, model No. 2450/500, available from As One Corporation) filled with a 5 mass % sodium hydroxide aqueous solution. The remaining one opening was connected to a PFA tube for supplying bromine using a feed pump. Nitrogen gas with a carbon dioxide concentration less than 1 ppm was then introduced through the PFA tube at 200 ccm (25° C.) for 20 minutes, to purge carbon dioxide in the gas phase. At this time, the carbon dioxide concentration in the gas phase was 1 ppm or less.

Subsequently, a magnetic stirrer (C-MAG HS10, available from As One Corporation) was placed in the bottom portion of the four-neck flask and rotated at 300 rpm to stir the contents, and while the periphery of the four-neck flask was cooled with ice water, bromine (available from Fujifilm Wako Pure Chemical Corp., specification purity of 99%) was supplied at a rate of 1.6 g/min for three minutes, and a tetramethylammonium hypobromite aqueous solution (0.51 mass % equivalent, 0.03 mol/L) was obtained. At this time, the solution temperature during the reaction was 11°C.

Production of Treatment Liquid

With the prepared aqueous solution remaining in the four-neck flask made of glass, the solution was transferred into a glove bag so as not to come into contact with air, and after the carbon dioxide concentration in the glove bag became 1 ppm or less, the solution was transferred to a 1 L PEA container. Subsequently, a treatment liquid was produced by dissolving 300 g of the buffer in 600 g of the prepared solution, and then dissolving the tetramethylammonium bromide, tetramethylammonium bromite aqueous solution, tetramethylammonium bromate aqueous solution, tetramethylammonium hypochlorite aqueous solution, tetramethylammonium chloride, and tetramethylammonium chlorate aqueous solution described in Example 1 so as to make the composition shown in Tables 1 to 4, and then the treatment liquid was evaluated.

Examples 12 to 20, 53 and 54 and Comparative Examples 3 to 5

Treatment liquids of Examples 12 to 20, 53, and 54, and Comparative Examples 3 to 5 were prepared and evaluated by the same method as in Example 11 such that the pH and the concentrations of (A) the hypobromite ions, (B) the pH buffer, (C) the onium ions, (D) the bromide ions, (E) the bromite ions and bromate ions, and (F) the chlorite ions, chlorate ions, chloride ions, and hypochlorite ions were as indicated for the compositions shown in Tables 1-4.

Example 21

Preparation of Phosphate Buffer

An amount of 500 g of a 25 mass % tetramethylammonium hydroxide aqueous solution was added into a PFA vessel, and 60.3 g of phosphoric acid (available from Fujifilm Wako Pure Chemical Corp., specification purity of 85%) was added while being cooled with ice water, and a phosphate buffer was prepared. The buffer concentration was calculated by the method described above using the ion chromatography analyzer.

Preparation of Tetramethylammonium Chlorite Aqueous Solution

Sodium chlorite (available from Alfa Aesar) was added to ion exchange water until saturation was reached. The saturated aqueous solution of sodium chlorite was stored in a refrigerator overnight. The precipitated sodium chlorite was collected by filtration. The recovered sodium chlorite was diluted with ultrapure water and analyzed using an ion chromatography analyzer. The $CO_3^-$, $SO_4^-$, and $Cl^-$ in the diluted solution were analyzed, and a decrease in $Na_2CO_3$, $Na_2SO_4$, and NaCl contained as impurities was confirmed. The above purification operation was repeated until it was confirmed that $CO_3^-$, $SO_4^-$, and $Cl^-$ were each 500 ppb or less, and sodium chlorite was purified.

Next, 9.0 g of the purified sodium chlorite was placed in a fluororesin container, after which 991 g of ultrapure water was added thereto, and a 0.9 mass % (0.1 mol/L) sodium chlorite aqueous solution was prepared. By the same method used in the preparation of the aqueous tetramethylammonium bromite solution, the prepared sodium chlorite aqueous solution was passed through an ion exchange resin exchanged to a tetramethylammonium form. The Na concentration of the recovered tetramethylammonium chlorite was analyzed using high-frequency inductively-coupled plasma emission spectroscopy (iCAP 6500 DuO, available from Thermo Fisher Scientific Inc.), and the sufficient implementation of ion exchange was confirmed. If ion exchange was insufficient, the above operation was repeated until a 1.4 mass % (0.1 mol/L) tetramethylammonium chlorite aqueous solution having a Na concentration of 500 ppb or less was prepared.

Preparation of Tetramethylammonium Hypobromite Aqueous Solution

In a 2-L glass four-neck flask (available from Cosmos Bead Co., Ltd.), 58 g of a 25 mass % tetramethylammonium hydroxide aqueous solution and 942 g of ultrapure water were mixed, and a 0.82 mass % (0.09 mol/L) tetramethylammonium hydroxide aqueous solution with a $CO_2$ content of 0.5 ppm was prepared. The pH at this time was 13.0.

A rotor (available from As One Corporation, 30 mm in total length×8 mm in diameter) was then placed in the four-necked flask, a thermometer protecting tube (available from Cosmos Bead Co., Ltd., bottom-sealed type) and a thermometer were placed in one opening, and in another opening, the leading end of a PFA tube (F-8011-02, available from Flon Industry) connected to a nitrogen gas cylinder was installed above the liquid surface. Another opening was connected to a gas-washing bottle (gas-washing bottle, model No. 2450/500, available from As One Corporation) filled with a 5 mass % sodium hydroxide aqueous solution. The remaining one opening was connected to a PFA tube for supplying bromine using a feed pump. Nitrogen gas with a carbon dioxide concentration less than 1 ppm was then introduced through the PFA tube at 200 ccm (25° C.) for 20 minutes, to purge carbon dioxide in the gas phase. At this time, the carbon dioxide concentration in the gas phase was 1 ppm or less.

Subsequently, a magnetic stirrer (C-MAG HS10, available from As One Corporation) was placed in the bottom portion of the four-neck flask and rotated at 300 rpm to stir the contents, and while the periphery of the four-neck flask was cooled with ice water, bromine (available from Fujifilm Wako Pure Chemical Corp., specification purity of 99%) was supplied at a rate of 2.4 g/min for one minute, and a tetramethylammonium hypobromite aqueous solution (2.4 mass % equivalent, 0.015 mol/L) was prepared. At this time, the solution temperature during the reaction was 11° C., Production of Treatment Liquid The prepared solution remaining in the four-neck flask made of glass was transferred into a glove bag so as not to come into contact with air, and after the carbon dioxide concentration in the glove bag became 1 ppm or less, the solution was transferred to a 1 L PFA container. Subsequently, a treatment liquid was produced by dissolving 300 g of the buffer in 600 g of the prepared solution, and then dissolving the tetramethylammonium bromide, tetramethylammonium bromite aqueous solution, tetramethylammonium bromate aqueous solution, tetramethylammonium hypochlorite aqueous solution, tetramethylammonium chloride, and tetramethylammonium chlorate aqueous solution described in Example 1, as well as tetramethylammonium chlorite so as to make the composition shown in Tables 1 to 4, and then the treatment liquid was evaluated.

Examples 22 to 44, 47 to 50, 55 and 56 and Comparative Examples 6 to 8

Treatment liquids of Examples 22 to 44, 47 to 50, 55 and 56 and Comparative Examples 6 to 8 were prepared and evaluated by the same method as in Example 21 such that the pH and the concentrations of (A) the hypobromite ions, (B) the pH buffer, (C) the onium ions, (D) the bromide ions, (E) the bromite ions and bromate ions, and (F) the chlorite ions, chlorate ions, chloride ions, and hypochlorite ions were as indicated for the compositions shown in Tables 1-4.

Examples 45 and 46

Treatment liquids of Examples 45 and 46 were prepared and evaluated by the same method as in Example 21 such that (A) the hypobromite ions, (B) the pH buffer, (C) the onium ions, and (F) the chloride ions were as indicated for the compositions shown in Table 3. Note that of the (C) onium ions, a tetrapropylammonium hydroxide aqueous solution (available from Tokyo Chemical Industry Co., Ltd., 40 mass %) was used for tetrapropylammonium ions.

The compositions of the prepared treatment liquids are shown in Tables 1, 2, 3, and 4, and the yielded results are shown in Tables 5 and 6. It was confirmed that the treatment liquids of the present embodiment exhibited excellent etching rate stability due to the reduced fluctuation in pH.

TABLE 1

| | (A) Hypobromite ion (mol/L) (HBrO and BrO⁻) | (B) pH buffer | (B) pH buffer (mol/L) | (C) Onium ion | (C) Onium ion (mol/L) (TMA⁻) | (D) Bromide Ion (mol/L) |
|---|---|---|---|---|---|---|
| Example 1 | 0.010 | boric acid | 0.36 | tetramethylammonium ion | 0.40 | 0.012 |
| Example 2 | 0.010 | boric acid | 0.36 | tetramethylammonium ion | 0.39 | 0.015 |
| Example 3 | 0.020 | boric acid | 0.31 | tetramethylammonium ion | 0.35 | 0.020 |
| Example 4 | 0.010 | boric acid | 0.02 | tetramethylammonium ion | 0.05 | 0.020 |
| Example 5 | 0.010 | boric acid | 0.20 | tetramethylammonium ion | 0.21 | 0.001 |
| Example 6 | 0.001 | boric acid | 0.36 | tetramethylammonium ion | 0.36 | 0.001 |
| Example 7 | 0.001 | boric acid | 0.16 | tetramethylammonium ion | 0.18 | 0.012 |
| Example 8 | 0.010 | boric acid | 0.36 | tetramethylammonium ion | 0.38 | 0.012 |
| Example 9 | 0.010 | boric acid | 0.36 | tetramethylammonium ion | 0.40 | 0.015 |
| Example 10 | 0.020 | boric acid | 0.31 | tetramethylammonium ion | 0.42 | 0.030 |
| Example 11 | 0.020 | carbonic acid | 0.92 | tetramethylammonium ion | 0.99 | 0.024 |
| Example 12 | 0.020 | carbonic acid | 0.92 | tetramethylammonium ion | 0.96 | 0.024 |
| Example 13 | 0.010 | carbonic acid | 0.59 | tetramethylammonium ion | 0.62 | 0.012 |
| Example 14 | 0.030 | carbonic acid | 0.59 | tetramethylammonium ion | 0.66 | 0.036 |
| Example 15 | 0.020 | carbonic acid | 0.92 | tetramethylammonium ion | 0.97 | 0.024 |
| Example 16 | 0.020 | carbonic acid | 0.18 | tetramethylammonium ion | 0.25 | 0.024 |
| Example 17 | 0.020 | carbonic acid | 0.07 | tetramethylammonium ion | 0.11 | 0.024 |
| Example 18 | 0.020 | carbonic acid | 0.42 | tetramethylammonium ion | 0.46 | 0.024 |
| Example 19 | 0.020 | carbonic acid | 0.37 | tetramethylammonium ion | 0.45 | 0.030 |
| Example 20 | 0.040 | carbonic acid | 0.32 | tetramethylammonium ion | 0.50 | 0.060 |
| Example 21 | 0.010 | phosphoric acid | 0.35 | tetramethylammonium ion | 0.82 | 0.015 |
| Example 22 | 0.010 | phosphoric acid | 0.35 | tetramethylammonium ion | 0.71 | 0.001 |
| Example 23 | 0.100 | phosphoric acid | 0.35 | tetramethylammonium ion | 1.04 | 0.200 |
| Example 24 | 0.030 | phosphoric acid | 0.19 | tetramethylammonium ion | 0.47 | 0.045 |
| Example 25 | 0.060 | phosphoric acid | 0.24 | tetramethylammonium ion | 0.67 | 0.120 |
| Example 26 | 0.150 | phosphoric acid | 0.35 | tetramethylammonium ion | 1.01 | 0.150 |
| Example 27 | 0.200 | phosphoric acid | 0.32 | tetramethylammonium ion | 1.15 | 0.280 |
| Example 28 | 0.050 | phosphoric acid | 0.11 | tetramethylammonium ion | 0.34 | 0.070 |
| Example 29 | 0.050 | phosphoric acid | 0.26 | tetramethylammonium ion | 0.65 | 0.060 |

TABLE 2

| | (E) Bromite ion (mol/L) | (E) Bromate ion (mol/L) | Hypochlorite ion (mol/L) | (F) Chlorite ion (mol/L) | (F) Chlorate ion (mol/L) | (F) Chloride ion (mol/L) | Treatment temperature (° C.) |
|---|---|---|---|---|---|---|---|
| Example 1 | 0.0001 | 0.0001 | 0.01 | | 0.00033 | 0.011 | 25 |
| Example 2 | 0.0010 | 0.0010 | | | | | 25 |
| Example 3 | 0.0010 | 0.0001 | | | | | 25 |
| Example 4 | 0.0020 | 0.0020 | | | | | 25 |
| Example 5 | 0.0001 | 0.0001 | | | | | 25 |
| Example 6 | | | | | | | 50 |
| Example 7 | 0.0010 | 0.0010 | | | | | 50 |
| Example 8 | 0.0010 | 0.0010 | | | | | 25 |
| Example 9 | 0.0020 | 0.0020 | 0.01 | | | | 25 |
| Example 10 | 0.0100 | 0.0100 | 0.02 | | 0.00067 | 0.021 | 25 |
| Example 11 | 0.0040 | 0.0040 | 0.01 | | 0.00067 | 0.011 | 25 |
| Example 12 | 0.0020 | 0.0020 | | | | | 25 |
| Example 13 | 0.0040 | 0.0040 | | | | | 25 |
| Example 14 | 0.0030 | 0.0003 | | | | | 50 |
| Example 15 | 0.0040 | 0.0040 | | | | | 25 |
| Example 16 | 0.0110 | 0.0110 | | | | | 25 |
| Example 17 | | | | | | | 25 |
| Example 18 | 0.0020 | 0.0020 | | | | | 25 |
| Example 19 | 0.0040 | 0.0040 | 0.02 | | | | 25 |
| Example 20 | 0.0200 | 0.0200 | 0.02 | | 0.00133 | 0.023 | 25 |
| Example 21 | 0.0010 | 0.0010 | 0.05 | 0.00011 | 0.00011 | 0.050 | 25 |
| Example 22 | 0.0003 | 0.0003 | | | | | 50 |
| Example 23 | 0.0200 | 0.0200 | | | | | 70 |
| Example 24 | 0.0120 | 0.0120 | | | | | 25 |
| Example 25 | 0.0006 | 0.0006 | | | | | 25 |
| Example 26 | 0.0075 | 0.0075 | | | | | 25 |
| Example 27 | 0.0200 | 0.0200 | | | | | 25 |
| Example 28 | | | | | | | 25 |
| Example 29 | 0.0050 | 0.0050 | | | | | 25 |

TABLE 3

|  | (A) Hypobromite ion (mol/L) (HBrO and BrO⁻) | (B) pH buffer | (B) pH buffer (mol/L) | (C) Onium ion | (C) Onium ion (mol/L) (TMA+) | (D) Bromide ion (mol/L) |
|---|---|---|---|---|---|---|
| Example 30 | 0.010 | boric acid | 0.36 | tetramethylammonium ion | 0.40 | 0.012 |
| Example 31 | 0.010 | boric acid | 0.36 | tetramethylammonium ion | 0.39 | 0.015 |
| Example 32 | 0.020 | boric acid | 0.31 | tetramethylammonium ion | 0.35 | 0.020 |
| Example 33 | 0.010 | boric acid | 0.02 | tetramethylammonium ion | 0.05 | 0.020 |
| Example 34 | 0.010 | boric acid | 0.20 | tetramethylammonium ion | 0.21 | 0.001 |
| Example 35 | 0.001 | boric acid | 0.36 | tetramethylammonium ion | 0.36 | 0.001 |
| Example 36 | 0.001 | boric acid | 0.16 | tetramethylammonium ion | 0.18 | 0.012 |
| Example 37 | 0.010 | boric acid | 0.36 | tetramethylammonium ion | 0.38 | 0.012 |
| Example 38 | 0.010 | boric acid | 0.36 | tetramethylammonium ion | 0.40 | 0.015 |
| Example 39 | 0.020 | boric acid | 0.31 | tetramethylammonium ion | 0.42 | 0.030 |
| Example 40 | 0.020 | carbonic acid | 0.92 | tetramethylammonium ion | 0.99 | 0.024 |
| Example 41 | 0.020 | carbonic acid | 0.92 | tetramethylammonium ion | 0.96 | 0.024 |
| Example 42 | 0.010 | carbonic acid | 0.59 | tetramethylammonium ion | 0.62 | 0.012 |
| Example 43 | 0.030 | carbonic acid | 0.59 | tetramethylammonium ion | 0.66 | 0.036 |
| Example 44 | 0.020 | carbonic acid | 0.92 | tetramethylammonium ion | 0.97 | 0.024 |
| Example 45 | 0.030 | phosphoric acid | 0.35 | tetramethylammonium ion (0.857 mol/L) tetrapropylammonium ion (0.100 mol/L) | 1.16 | 0.030 |
| Example 46 | 0.060 | phosphoric acid | 0.35 | tetrapropylammonium ion | 0.82 | 0.060 |
| Example 47 | 0.030 | phosphoric acid | 0.001 | tetramethylammonium ion | 0.16 | 0.03 |
| Example 48 | 0.030 | phosphoric acid | 0.005 | tetramethylammonium ion | 0.17 | 0.03 |
| Example 49 | 0.030 | phosphoric acid | 0.050 | tetramethylammonium ion | 0.26 | 0.03 |
| Example 50 | 0.030 | phosphoric acid | 0.00001 | tetramethylammonium ion | 0.16 | 0.03 |
| Comparative Example 1 | 0.010 |  |  | tetramethylammonium ion | 0.04 | 0.012 |
| Comparative Example 2 | 0.020 |  |  | tetramethylammonium ion | 0.04 | 0.020 |
| Comparative Example 3 | 0.020 |  |  | tetramethylammonium ion | 0.07 | 0.024 |
| Comparative Example 4 | 0.030 |  |  | tetramethylammonium ion | 0.07 | 0.036 |
| Comparative Example 5 |  | carbonic acid | 0.59 | tetramethylammonium ion | 0.79 |  |
| Comparative Example 6 | 0.040 |  |  | tetramethylammonium ion | 0.10 | 0.060 |
| Comparative Example 7 | 0.050 |  |  | tetramethylammonium ion | 0.12 | 0.070 |
| Comparative Example 8 |  | phosphoric acid | 0.35 | tetramethylammonium ion | 1.30 |  |

TABLE 4

|  | (E) Bromite ion (mol/L) | (E) Bromate ion (mol/L) | Hypochlorite ion (mol/L) | (F) Chlorite ion (mol/L) | (F) Chlorate ion (mol/L) | (F) Chloride ion (mol/L) | Treatment temperature (° C.) |
|---|---|---|---|---|---|---|---|
| Example 30 | 0.0160 | 0.0160 | 0.01 |  |  |  | 25 |
| Example 31 | 0.0400 | 0.0400 | 0.05 |  | 0.00267 | 0.055 | 25 |
| Example 32 | 0.0040 | 0.0040 | 0.10 |  | 0.00333 | 0.107 | 25 |
| Example 33 | 0.0200 | 0.0200 | 0.10 | 0.0011 | 0.00111 | 0.102 | 25 |
| Example 34 | 0.008 | 0.008 |  |  |  |  | 25 |
| Example 35 | 0.005 | 0.005 |  |  |  |  | 25 |
| Example 36 | 0.0001 | 0.0001 |  |  |  |  | 25 |
| Example 37 | 0.100 | 0.100 |  |  |  |  | 25 |
| Example 38 |  |  |  |  |  |  | 25 |
| Example 39 | 0.005 | 0.005 | 0.01 | 0.1000 | 0.1 | 0.5 | 25 |
| Example 40 | 0.005 | 0.005 | 0.01 |  |  | 0.1 | 25 |
| Example 41 | 0.005 | 0.005 | 0.01 |  |  | 0.001 | 25 |
| Example 42 |  |  |  |  |  | 0.5 | 25 |
| Example 43 |  |  |  |  |  | 0.3 | 25 |
| Example 44 |  |  |  |  |  | 0.1 | 25 |
| Example 45 |  |  |  |  |  | 0.3 | 25 |
| Example 46 |  |  |  |  |  |  | 25 |
| Example 47 | 0.001 | 0.001 | 0.05 | 0.0001 | 0.0001 | 0.05 | 25 |
| Example 48 | 0.001 | 0.001 | 0.05 | 0.0001 | 0.0001 | 0.05 | 25 |
| Example 49 | 0.001 | 0.001 | 0.05 | 0.0001 | 0.0001 | 0.05 | 25 |
| Example 50 | 0.001 | 0.001 | 0.05 | 0.0001 | 0.0001 | 0.05 | 25 |
| Comparative Example 1 | 0.0001 | 0.0001 | 0.01 |  | 0.00033 | 0.011 | 25 |
| Comparative Example 2 | 0.0010 | 0.0001 |  |  |  |  |  |

TABLE 4-continued

|  | (E) Bromite ion (mol/L) | (E) Bromate ion (mol/L) | Hypochlorite ion (mol/L) | (F) Chlorite ion (mol/L) | (F) Chlorate ion (mol/L) | (F) Chloride ion (mol/L) | Treatment temperature (° C.) |
|---|---|---|---|---|---|---|---|
| Comparative Example 3 | 0.0040 | 0.0040 | 0.01 |  | 0.00067 | 0.011 | 25 |
| Comparative Example 4 | 0.0030 | 0.0003 |  |  |  |  | 50 |
| Comparative Example 5 |  |  | 0.1 |  | 0.1 |  | 25 |
| Comparative Example 6 |  |  |  |  |  |  | 25 |
| Comparative Example 7 |  |  |  |  |  |  | 25 |
| Comparative Example 8 |  |  | 0.3 |  | 0.3 |  | 25 |

TABLE 5

|  | Initial pH (25° C.) | Initial Ru etching rate (Å/min) | pH after HCl addition (25° C.) | Ru etching rate (Å/min) after HCl addition | Etching rate Variation after acid addition |
|---|---|---|---|---|---|
| Example 1 | 9.23 | 49 | 9.23 | 49 | <1% |
| Example 2 | 9.23 | 51 | 9.23 | 51 | <1% |
| Example 3 | 9.23 | 112 | 9.3 | 115 | 3% |
| Example 4 | 9.31 | 47 | 9.2 | 51 | 9% |
| Example 5 | 9.28 | 45 | 9.21 | 54 | 21% |
| Example 6 | 9.26 | 30 | 9.25 | 31 | 3% |
| Example 7 | 9.24 | 31 | 9.24 | 31 | <1% |
| Example 8 | 9.23 | 38 | 9.23 | 38 | <1% |
| Example 9 | 9.23 | 55 | 9.23 | 55 | <1% |
| Example 10 | 9.31 | 102 | 9.29 | 108 | 6% |
| Example 11 | 10.57 | 44 | 10.54 | 48 | 9% |
| Example 12 | 10.57 | 42 | 10.57 | 42 | <1% |
| Example 13 | 10.57 | 20 | 10.54 | 22 | 10% |
| Example 14 | 10.57 | 85 | 10.54 | 93 | 9% |
| Example 15 | 10.61 | 43 | 10.61 | 43 | <1% |
| Example 16 | 10.58 | 46 | 10.56 | 49 | 7% |
| Example 17 | 10.57 | 41 | 10.5 | 50 | 22% |
| Example 18 | 10.55 | 44 | 10.51 | 49 | 11% |
| Example 19 | 10.57 | 44 | 10.53 | 49 | 11% |
| Example 20 | 10.58 | 101 | 10.56 | 107 | 6% |
| Example 21 | 12.63 | 32 | 12.59 | 33 | 3% |
| Example 22 | 12.64 | 21 | 12.63 | 22 | 6% |
| Example 23 | 12.63 | 217 | 12.61 | 243 | 11% |
| Example 24 | 12.64 | 44 | 12.6 | 52 | 15% |
| Example 25 | 12.67 | 108 | 12.61 | 121 | 11% |
| Example 26 | 12.65 | 301 | 12.61 | 319 | 6% |
| Example 27 | 12.61 | 511 | 12.59 | 603 | 15% |
| Example 28 | 12.63 | 83 | 12.57 | 90 | 8% |
| Example 29 | 12.63 | 89 | 12.6 | 105 | 15% |

TABLE 6

|  | Initial pH (25° C.) | Initial Ru etching rate (Å/min) | pH after HCl addition (25° C.) | Ru etching rate (Å/min) after HCl addition | Etching rate variation after acid addition |
|---|---|---|---|---|---|
| Example 30 | 12.66 | 186 | 12.6 | 231 | 19% |
| Example 31 | 12.61 | 208 | 12.53 | 227 | 8% |
| Example 32 | 12.63 | 183 | 12.6 | 217 | 9% |
| Example 33 | 12.63 | 199 | 12.6 | 209 | 5% |
| Example 34 | 12.67 | 97 | 12.61 | 105 | 8% |
| Example 35 | 12.64 | 34 | 12.6 | 36 | 6% |
| Example 36 | 12.62 | 33 | 12.61 | 35 | 6% |
| Example 37 | 12.62 | 35 | 12.6 | 36 | 3% |
| Example 38 | 12.64 | 39 | 12.61 | 41 | 5% |
| Example 39 | 12.63 | 35 | 12.61 | 37 | 5% |

TABLE 6-continued

|  | Initial pH (25° C.) | Initial Ru etching rate (Å/min) | pH after HCl addition (25° C.) | Ru etching rate (Å/min) after HCl addition | Etching rate variation after acid addition |
|---|---|---|---|---|---|
| Example 40 | 12.62 | 33 | 12.61 | 34 | 3% |
| Example 41 | 12.62 | 38 | 12.6 | 40 | 5% |
| Example 42 | 12.63 | 39 | 12.61 | 40 | 3% |
| Example 43 | 12.64 | 35 | 12.61 | 38 | 8% |
| Example 44 | 12.62 | 34 | 12.61 | 35 | 3% |
| Example 45 | 12.62 | 26 | 12.6 | 28 | 7% |
| Example 46 | 12.65 | 30 | 12.63 | 32 | 6% |
| Example 47 | 12.64 | 120 | 12.61 | 138 | 13% |
| Example 48 | 12.63 | 110 | 12.6 | 126 | 13% |
| Example 49 | 12.63 | 80 | 12.58 | 87 | 8% |
| Example 50 | 12.64 | 123 | 12.59 | 144 | 15% |
| Comparative Example 1 | 9.23 | 56 | 8.02 | 240 | 72% |
| Comparative Example 2 | 9.25 | 127 | 8.11 | 401 | 68% |
| Comparative Example 3 | 10.63 | 52 | 9.05 | 196 | 74% |
| Comparative Example 4 | 10.55 | 97 | 9.14 | 342 | 72% |
| Comparative Example 5 | 10.62 | 1 | 10.61 | 2 | 50% |
| Comparative Example 6 | 12.63 | 130 | 12.41 | 216 | 40% |
| Comparative Example 7 | 12.63 | 182 | 12.38 | 319 | 75% |
| Comparative Example 8 | 12.63 | 1 | 12.63 | 2 | 50% |

Examples 51 and 52

Treatment liquids of Examples 51 and 52 were prepared and evaluated by the same method as in Example 1 such that (A) the hypobromite ions, (B) the pH buffer, and (C) the onium ions were as indicated for the compositions shown in Table 7. Note that of the (C) onium ions, a tetrapropylammonium hydroxide aqueous solution (available from Tokyo Chemical Industry Co,, Ltd., 40 mass %) was used for tetrapropylammonium ions.

Examples 53 and 54

Treatment liquids of Examples 53 and 54 were prepared and evaluated by the same method as in Example 11 such that (A) the hypobromite ions, (B) the pH buffer, and (C) the onium ions were as indicated for the compositions shown in Table 7. Note that of the (C) onium ions, a tetrapropylammonium hydroxide aqueous solution (available from Tokyo Chemical Industry Co., Ltd., 40 mass %) was used for tetrapropylammonium ions.

Examples 55 and 56

Treatment liquids of Examples 55 and 56 were prepared and evaluated by the same method as in Example 21 such that (A) the hypobromite ions, (B) the pH buffer, and (C) the onium ions were as indicated for the compositions shown in Table 7. Note that of the (C) onium ions, a tetrapropylammonium hydroxide aqueous solution (available from Tokyo Chemical Industry Co., Ltd., 40 mass %) was used for tetrapropylammonium ions.

Example 57

A treatment liquid of Example 57 was prepared and evaluated by the same method as in Example 21 such that (A) the hypobromite ions, (B) the pH buffer, and (C) the onium ions were as indicated for the compositions shown in Table 7. Note that, of the (C) onium ions, n-octyltrimethylammonium chloride (available from Tokyo Chemical Industry Co., Ltd., purity>98%) was used.

Example 58

A treatment liquid of Example 58 was prepared and evaluated by the same method as in Example 21 such that (A) the hypobromite ions, (B) the pH buffer, and (C) the onium ions were as indicated for the compositions shown in Table 7. Note that of the (C) onium ions, hexadecyltrimethylammonium chloride (available from Tokyo Chemical Industry Co., Ltd., purity >95%) was used.

Example 59

A treatment liquid of Example 59 was prepared and evaluated by the same method as in Example 21 such that (A) the hypobromite ions, (B) the pH buffer, and (C) the onium ions were as indicated for the compositions shown in Table 7. Note that of the (C) onium ions, 5-azoniaspiro[4.4]nonane chloride (available from Tokyo Chemical Industry Co., Ltd., purity>98%) was used.

Example 60

A treatment liquid of Example 60 was prepared and evaluated by the same method as in Example 21 such that (A) the hypobromite ions, (B) the pH buffer, and (C) the onium ions were as indicated for the compositions shown in Table 7. Note that of the (C) onium ions, hexamethonium bromide (available from Tokyo Chemical Industry Co., Ltd., purity>98%) was used.

Evaluations

The pH and hypobromite ion concentration of the prepared treatment liquid were evaluated, and the onium ion concentration, the ruthenium etching rate, the pH after the addition of hydrochloric acid, the ruthenium etching rate after acid addition, the etching rate variation before and after addition of the hydrochloric acid, and a quantitative analysis of $RuO_4$ gas were evaluated. The results are shown in Table 8. From the results of Table 8, it is clear that even when two onium ions represented by formula (1) are included, the percentage of variation in the etching rate can be reduced to a low level.

TABLE 7

|  | (A) Hypobromite ion (mol/L) (HBrO and BrO−) | (B) pH buffer | (B) pH buffer (mol/L) | (C) Onium ion | (C) Onium ion (mol/L) | Treatment temperature (° C.) |
|---|---|---|---|---|---|---|
| Example 51 | 0.01 | boric acid | 0.59 | tetramethylammonium ion | 0.60 | 25 |
|  |  |  |  | tetrapropylammonium ion | 0.43 |  |
| Example 52 | 0.01 | boric acid | 0.59 | tetramethylammonium ion | 0.60 | 25 |
| Example 53 | 0.02 | carbonic acid | 0.92 | tetramethylammonium ion | 0.94 | 25 |
|  |  |  |  | tetrapropylammonium ion | 0.43 |  |
| Example 54 | 0.02 | carbonic acid | 0.92 | tetramethylammonium ion | 0.94 | 25 |
| Example 55 | 0.01 | phosphoric acid | 0.34 | tetramethylammonium ion | 0.69 | 25 |
|  |  |  |  | tetrapropylammonium ion | 0.43 |  |
| Example 56 | 0.01 | phosphoric acid | 0.34 | tetramethylammonium ion | 0.69 | 25 |
| Example 57 | 0.01 | phosphoric acid | 0.34 | tetramethylammonium ion | 0.69 | 25 |
|  |  |  |  | n-octyltrimethylammonium ion | 0.12 |  |
| Example 58 | 0.01 | phosphoric acid | 0.34 | tetramethylammonium ion | 0.69 | 25 |
|  |  |  |  | hexadecyltrimethylammonium ion | 0.14 |  |
| Example 59 | 0.01 | phosphoric acid | 0.34 | tetramethylammonium ion | 0.69 | 25 |
|  |  |  |  | 5-azoniaspiro[4.4]nonane ion | 0.1 |  |
| Example 60 | 0.01 | phosphoric acid | 0.34 | tetramethylammonium ion | 0.69 | 25 |
|  |  |  |  | hexamethonium ion | 0.15 |  |

TABLE 8

|  | Initial pH (25° C.) | Initial Ru etching (Å/min) | pH after HCl addition (25° C.) | Ru etching (Å/min) after HCl addition | Etching rate variation after acid addition | Gas generation amount (μg/cm$^2$) |
|---|---|---|---|---|---|---|
| Example 51 | 9.23 | 51 | 9.23 | 51 | <1% | 26 |
| Example 52 | 9.23 | 55 | 9.23 | 55 | <1% | 145 |
| Example 53 | 10.57 | 42 | 10.57 | 42 | <1% | 18 |
| Example 54 | 10.57 | 50 | 10.57 | 50 | <1% | 131 |
| Example 55 | 12.64 | 32 | 12.63 | 33 | 3% | 4 |
| Example 56 | 12.64 | 40 | 12.63 | 41 | 2% | 22 |
| Example 57 | 12.64 | 24 | 12.63 | 24 | <1% | 2 |
| Example 58 | 12.64 | 22 | 12.63 | 22 | <1% | 3 |
| Example 59 | 12.64 | 28 | 12.63 | 28 | <1% | 7 |
| Example 60 | 12.64 | 24 | 12.63 | 24 | <1% | 4 |

Examples 61 to 64 and Comparative Example 11

Treatment liquids of Examples 61 to 64 and Comparative Example 11 were prepared and evaluated by the same method as in Example 21 such that the pH and the concentrations of (A) the hypobromite ions, (B) the pH buffer, (C) the onium ions, (D) the bromide ions, (E) the bromite ions and bromate ions, and (F) the chlorite ions, chlorate ions, chloride ions, and hypochlorite ions were as indicated for the compositions shown in Tables 9 and 10.

Examples 65 to 67 and Comparative Example 9

Treatment liquids of Examples 65 to 67 and Comparative Example 9 were prepared and evaluated by the same method as in Example 1 such that the pH and the concentrations of (A) the hypobromite ions, (B) the pH buffer, (C) the onium ions, (D) the bromide ions, (E) the bromite ions and bromate ions, and (F) the chlorite ions, chlorate ions, chloride ions, and hypochlorite ions were as indicated fix the compositions shown in Tables 9 and 10.

Examples 68 to 70 and Comparative Example 10

Treatment liquids of Examples 68 to 70 and Comparative Example 10 were prepared and evaluated by the same method as in Example 11 such that the pH and the concentrations of (A) the hypobromite ions, (B) the pH buffer, (C) the onium ions, (D) the bromide ions, (E) the bromite ions and bromate ions, and (F) the chlorite ions, chlorate ions, chloride ions, and hypochlorite ions were as indicated for the compositions shown in Tables 9 and 10.

Example 71

Preparation of Tetramethylammonium Sulfate Aqueous Solution

Tetramethylammonium sulfate (available from Tokyo Chemical Industry Co., Ltd.) was added to ion exchange water until saturation was reached. The saturated aqueous solution of tetramethylammonium sulfate was stored in a refrigerator overnight. The precipitated tetramethylammonium sulfate was collected by filtration. The collected tetramethylammonium sulfate was diluted with ultrapure water and analyzed using an ion chromatography analyzer. The $CO_3$ and $Cl^-$ in the diluted solution were analyzed, and a decrease in $CO_3^-$ and $Cl^-$ included as impurities was confirmed. The above purification operation was repeated until it was confirmed that $CO_3^-$ and $Cl^-$ were each 500 ppb or less, and tetramethylammonium sulfate was purified.

An amount of 24.4 g of the purified tetramethylammonium sulfate was placed in a fluororesin container and then adjusted with 975.6 g of ultrapure water. The Na concentration was analyzed using high-frequency inductively-coupled plasma emission spectroscopy (iCAP 6500 DuO, available from Thermo Fisher Scientific Inc.), and the sufficient implementation of purification was confirmed. If purification was insufficient, the above operation was repeated until a 2.4 mass % (0.1 mol/L) tetramethylammonium sulfate aqueous solution having a Na concentration of 500 ppb or less was prepared.

Production of Treatment Liquid

The prepared solution was used, and a treatment liquid of Example 71 was prepared and evaluated by the same method as in Example 21 such that the pH and the concentrations of (A) the hypobromite ions, (B) the pH buffer, (C) the onium ions, (D) the bromide ions, (E) the bromite ions and bromate ions, and (F) sulfate ions were as indicated for the composition shown in Tables 9 and 10.

Evaluations

The prepared treatment liquid was stored for 7 days at a storage temperature of 23° C., after which the pH and hypobromite ion concentration in the treatment liquid were evaluated. The percentage of variation in the etching rate after storage was determined on the basis of the etching rate before storage. The results are shown in Table 11. From the results in Table 11, it is clear that even after storage, the percentage of variation in the etching rate can be reduced to a low level.

Example 72

A treatment liquid of Example 72 was prepared and evaluated by the same method as in Example 71 such that the pH and the concentrations of (A) the hypobromite ions, (B) the pH buffer, (C) the onium ions, (D) the bromide ions, (E) the bromite ions and bromate ions, and (F) the sulfate ions were as indicated for the composition shown in Tables 9 to 11.

TABLE 9

|  | (A) Hypobromite ion (mol/L) (HBrO and BrO⁻) | (B) pH buffer | (B) pH buffer (mol/L) | (C) Onium ion | (C) Onium ion (mol/L) (TMA⁺) | (D) Bromide ion (mol/L) |
|---|---|---|---|---|---|---|
| Example 61 | 0.060 | phosphoric acid | 0.35 | tetramethylammonium ion | 1.04 | 0.06 |
| Example 62 | 0.030 | phosphoric acid | 0.35 | tetramethylammonium ion | 1.01 | 0.06 |
| Example 63 | 0.030 | phosphoric acid | 0.35 | tetramethylammonium ion | 0.80 | 0.06 |
| Example 64 | 0.030 | phosphoric acid | 0.35 | tetramethylammonium ion | 1.06 | 0.03 |
| Example 65 | 0.010 | boric acid | 0.005 | tetramethylammonium ion | 0.05 | 0.012 |
| Example 66 | 0.01 | boric acid | 0.05 | tetramethylammonium ion | 0.05 | 0.012 |
| Example 67 | 0.01 | boric acid | 0.36 | tetramethylammonium ion | 0.05 | 0.012 |
| Example 68 | 0.02 | carbonic acid | 0.005 | tetramethylammonium ion | 0.08 | 0.024 |
| Example 69 | 0.02 | carbonic acid | 0.05 | tetramethylammonium ion | 0.08 | 0.024 |
| Example 70 | 0.020 | carbonic acid | 0.920 | tetramethylammonium ion | 0.08 | 0.024 |
| Example 71 | 0.030 | phosphoric acid | 0.35 | tetramethylammonium ion | 1.06 | 0.03 |
| Example 72 | 0.030 | phosphoric acid | 0.35 | tetramethylammonium ion | 1.46 | 0.03 |
| Comparative Example 9 | 0.010 |  |  | tetramethylammonium ion | 0.05 | 0.012 |
| Comparative Example 10 | 0.020 |  |  | tetramethylammonium ion | 0.08 | 0.024 |
| Comparative Example 11 | 0.030 |  |  | tetramethylammonium ion | 0.36 | 0.03 |

TABLE 10

|  | (E) Bromite ion (mol/L) | (E) Bromate ion (mol/L) | Hypochlorite ion (mol/L) | (F) Chlorite ion (mol/L) | (F) Chlorate ion (mol/L) | (F) Chloride ion (mol/L) | (F) Sulfate ion (mol/L) |
|---|---|---|---|---|---|---|---|
| Example 61 | 0.0075 | 0.0075 | 0.10 | 0.001 | 0.001 | 0.102 |  |
| Example 62 | 0.0075 | 0.0075 | 0.10 | 0.001 | 0.001 | 0.102 |  |
| Example 63 | 0.0075 | 0.0075 |  |  |  |  |  |
| Example 64 | 0.1000 | 0.1000 |  |  |  | 0.100 |  |
| Example 65 | 0.0001 | 0.0001 | 0.01 | 0.001 | 0.001 | 0.02 |  |
| Example 66 | 0.0001 | 0.0001 | 0.01 | 0.001 | 0.001 | 0.02 |  |
| Example 67 | 0.0001 | 0.0001 | 0.01 | 0.001 | 0.001 | 0.02 |  |

TABLE 10-continued

|  | (E) Bromite ion (mol/L) | (E) Bromate ion (mol/L) | Hypochlorite ion (mol/L) | (F) Chlorite ion (mol/L) | (F) Chlorate ion (mol/L) | (F) Chloride ion (mol/L) | (F) Sulfate ion (mol/L) |
|---|---|---|---|---|---|---|---|
| Example 68 | 0.004 | 0.004 | 0.01 | 0.001 | 0.001 | 0.02 |  |
| Example 69 | 0.004 | 0.004 | 0.01 | 0.001 | 0.001 | 0.02 |  |
| Example 70 | 0.004 | 0.004 | 0.01 |  |  | 0.02 |  |
| Example 71 | 0.1000 | 0.1000 |  |  |  |  | 0.100 |
| Example 72 | 0.1000 | 0.1000 |  |  |  |  | 0.500 |
| Comparative Example 9 | 0.0001 | 0.0001 | 0.01 | 0.001 | 0.001 | 0.02 |  |
| Comparative Example 10 | 0.004 | 0.004 | 0.01 | 0.001 | 0.001 | 0.02 |  |
| Comparative Example 11 | 0.1000 | 0.1000 | 0.01 | 0.001 | 0.001 | 0.100 |  |

TABLE 11

|  | Hypobromite ion concentration [mol/L] | | pH(25° C.) | | Ru etching rate [Å/min] | | |
|---|---|---|---|---|---|---|---|
|  | Immediately after manufacture | After 7 days | Immediately after manufacture | After 7 days | Immediately after manufacture | After 7 days | Etching rate variation after storage |
| Example 61 | 0.060 | 0.058 | 12.64 | 12.62 | 108 | 98 | 9% |
| Example 62 | 0.030 | 0.029 | 12.63 | 12.62 | 44 | 42 | 5% |
| Example 63 | 0.030 | 0.028 | 12.64 | 12.63 | 40 | 38 | 5% |
| Example 64 | 0.030 | 0.029 | 12.63 | 12.62 | 37 | 36 | 3% |
| Example 65 | 0.010 | 0.009 | 9.23 | 9.23 | 55 | 54 | 2% |
| Example 66 | 0.01 | 0.009 | 9.23 | 9.22 | 54 | 53 | 2% |
| Example 67 | 0.01 | 0.009 | 9.33 | 9.32 | 51 | 50 | 2% |
| Example 68 | 0.02 | 0.019 | 10.56 | 10.56 | 55 | 56 | 2% |
| Example 69 | 0.02 | 0.019 | 10.52 | 10.51 | 54 | 56 | 4% |
| Example 70 | 0.020 | 0.019 | 10.55 | 10.55 | 55 | 56 | 2% |
| Example 71 | 0.030 | 0.029 | 12.69 | 12.52 | 43 | 50 | 16% |
| Example 72 | 0.030 | 0.029 | 12.69 | 12.48 | 46 | 54 | 17% |
| Comparative Example 9 | 0.010 | 0.009 | 9.23 | 8.97 | 59 | 98 | 66% |
| Comparative Example 10 | 0.020 | 0.019 | 10.53 | 10.38 | 58 | 90 | 55% |
| Comparative Example 11 | 0.03 | 0.029 | 12.64 | 12.44 | 54 | 72 | 33% |

Example 73

A treatment liquid of Example 73 was prepared and evaluated by the same method as in Example 21 such that (A) the hypobromite ions, (B) the pH buffer, (C) the onium ions, and the pH were as indicated for the composition shown in Tables 12 and 13.

Comparative Example 12

In a 2-L glass three-neck flask (available from Cosmos Bead Co., Ltd.), 209 g of a 25 mass % tetramethylammonium hydroxide aqueous solution and 791 g of ultrapure water were mixed, and a 5.2 mass % tetramethylammonium hydroxide aqueous solution with a $CO_2$ content of 0.5 ppm was prepared. The pH at this time was 13.8.

A rotor (available from As One, 30 mm in total length×8 mm in diameter) was then placed in the three-necked flask, and a thermometer protecting tube (available from Cosmos Bead Co., Ltd., bottom-sealed type) and a thermometer were placed in one opening, and in another opening, the leading end of a PFA tube (F-8011-02, available from Flon industry) connected to a chlorine gas cylinder and a nitrogen gas cylinder was immersed in the bottom of the solution, such that switch between chlorine gas and nitrogen gas could be made optionally. The remaining one opening was connected to a gas-washing bottle (gas-washing bottle, model No. 2450/500, available from As One Corporation) filled with a 5 mass % sodium hydroxide aqueous solution. Nitrogen gas with a carbon dioxide concentration of less than 1 ppm was then introduced from the PFA tube at 0.289 Pa·m³/second (when converted to 0° C.) for 20 minutes to purge carbon dioxide in the gas phase. At this time, the carbon dioxide concentration in the gas phase was 1 ppm or less.

A magnetic stirrer (C-MAG HS10, available from As One Corporation) was placed in the bottom portion of the three-neck flask and rotated at 300 rpm to stir the contents, and while the periphery of the three-neck flask was cooled with ice water, chlorine gas (available from Fujiox Co., Ltd., specification purity 99.4%) was supplied at 0.059 Pa·m³/second (when converted to 0°C.) for 180 minutes, and a mixed solution of a tetramethylammonium hypochlorite aqueous solution (oxidizing agent; 3.51 mass % equivalent, 0.28 mol/L) and tetramethylammonium hydroxide (0.09 mass % equivalent, 0.0097 mol/L) was prepared. At this time, the solution temperature during the reaction was 11° C.

Boric acid, hydrochloric acid, and ultrapure water were added to the prepared tetramethylammonium hypochlorite aqueous solution, and a treatment liquid of the composition shown in Tables 12 and 13 was prepared. The prepared treatment liquid was evaluated by the same method as Example 21.

In the case of Comparative Example 12, the ruthenium was not etched by the treatment liquid.

Comparative Example 13

A treatment liquid of Comparative Example 13 was prepared by the same method as in Comparative Example 12 so as to have the composition indicated in Tables 12 and 13. The prepared treatment liquid was evaluated by the same method as in Example 21.

TABLE 12

| | Hypobromite ion or hypochlorite ion (mol/L) | (B) pH buffer | (B) pH buffer (mol/L) | (C) Onium ion | (C) Onium ion (mol/L) (TMA$^+$) |
|---|---|---|---|---|---|
| Example 73 | BrO$^-$ (0.02) | phosphoric acid | 0.05 | tetramethylammonium ion | 0.05 |
| Comparative Example 12 | ClO$^-$ (0.28) | phosphoric acid | 0.05 | tetramethylammonium ion | 0.05 |
| Comparative Example 13 | ClO$^-$ (0.28) | boric acid | 0.05 | tetramethylammonium ion | 0.05 |

TABLE 13

| | Hypobromite ion or hypochlorite ion concentration [mol/L] | | pH (25° C.) | | Ru etching rate [Å/min] | | Etching rate variation after storage |
|---|---|---|---|---|---|---|---|
| | Immediately after manufacture | After 7 days | Immediately after manufacture | After 7 days | Immediately after manufacture | After 7 days | |
| Example 73 | 0.06 | 0.058 | 12.64 | 12.62 | 106 | 98 | 8% |
| Comparative Example 12 | 0.2 | 0.2 | 12.64 | 12.64 | 0 | 0 | 0% |
| Comparative Example 13 | 0.2 | 0.14 | 9.33 | 9.3 | 104 | 58 | 44% |

The treatment liquid of the present invention can reduce a change in the pH associated with an etching reaction of ruthenium or the absorption of carbon dioxide gas when the ruthenium is etched. Furthermore, the treatment liquid of the present invention can reduce the percentage of variation in the etching rate of ruthenium in the formation of a semiconductor element.

REFERENCE SIGNS LIST

1 Base
2 Interlayer insulating film
3 Ruthenium

The invention claimed is:

1. A semiconductor treatment liquid comprising (A), (B), (C), and (E) below:
   (A) a hypobromite ion,
   (B) a pH buffer,
   (C) an onium ion, and
   (E) one or more selected from the group consisting of a bromite ion and a bromate ion,
   wherein a concentration of the bromite ion and bromate ion (E) is $3.3 \times 10^{-6}$ mol/L or more and $5.0 \times 10^{-1}$ mol/L or less.

2. The semiconductor treatment liquid according to claim 1, further comprising (D) a bromide ion.

3. The semiconductor treatment liquid according to claim 1, further comprising an oxidizing agent, wherein an oxidation-reduction potential of the oxidizing agent exceeds an oxidation-reduction potential of a hypobromite ion/bromide ion system.

4. The semiconductor treatment liquid according to claim 3, wherein the oxidizing agent contained in the semiconductor treatment liquid is one or more selected from the group consisting of a hypochlorite ion and ozone.

5. The semiconductor treatment liquid according to claim 1, further comprising (F) one or more types of chlorine-containing ions selected from the group consisting of a chlorite ion, a chlorate ion, and a chloride ion.

6. The semiconductor treatment liquid according to claim 1, wherein the semiconductor treatment liquid contains a hypobromite ion at an amount of 0.001 mol/L or more and 0.20 mol/L or less.

7. The semiconductor treatment liquid according to claim 1, wherein the concentration of the pH buffer (B) is from 0.00001 to 1.0 mol/L.

8. The semiconductor treatment liquid according to claim 1, wherein the pH buffer (B) is at least one selected from the group consisting of carbonic acid, boric acid, phosphoric acid, tris(hydroxymethyl)aminomethane (tris), ammonia, pyrophosphoric acid, p-phenolsulfonic acid, diethanolamine, ethanolamine, triethanolamine, 5,5-diethylbarbituric acid, glycine, glycylglycine, imidazole, N,N-bis(2-hydroxyethyl)-2-aminoethanesulfonic acid, 3-morpholinopropanesulfonic acid, N-tris(hydroxymethyl)methyl-2-aminoethanesulfonic acid, 2-[4-(2-hydroxyethyl)-1-piperazinyl] ethanesulfonic acid, 4-(2-hydroxyethyl)-1-piperazinepropanesulfonic acid, tricine, N,N-di(2-hydroxyethyl)glycine, 2-cyclohexylaminoethane sulfonic acid, hydroxyproline, phenol, and ethylene diamine tetraacetic acid.

9. The semiconductor treatment liquid according to claim 1, wherein the onium ion (C) is a quaternary ammonium ion or a quaternary phosphonium ion represented by formula (1), a tertiary ammonium ion or a tertiary sulfonium ion represented by formula (2), an ammonium ion, a pyrrolidinium ion, a piperidinium ion, an imidazolium ion, or a sulfonium ion represented by formula (3), or an ammonium ion or a phosphonium ion represented by formula (4):

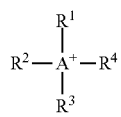 (1)

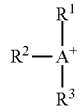 (2)

 (3)

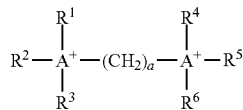 (4)

wherein, in formula (1), A is nitrogen or phosphorus, and $R^1$, $R^2$, $R^3$, and $R^4$ each independently denote an alkyl group having carbon number from 1 to 25, an allyl group, an aralkyl group in which an aryl group optionally have a substituent, or an aryl group; with the proviso that, in a case in which $R^1$, $R^2$, $R^3$, and $R^4$ are alkyl groups, the number of carbons of at least one alkyl group among $R^1$, $R^2$, $R^3$, and $R^4$ is two or more;

in formula (2), $A^+$ is nitrogen or sulfur, and $R^1$, $R^2$, and $R^3$ each independently denote an alkyl group having carbon number from 1 to 25, an allyl group, an aralkyl group having a alkyl group having carbon number from 1 to 25, or an aryl group; with the proviso that, in a case in which $R^1$, $R^2$, and $R^3$ are alkyl groups, the number of carbons of at least one alkyl group among $R^1$, $R^2$, and $R^3$ is two or more; furthermore, in an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9 or an alkenyloxy group having carbon number from 2 to 9, and in these groups, at least one hydrogen optionally is substituted with fluorine or chlorine;

in formula (3), Z is an aromatic or alicyclic group that optionally include a nitrogen atom, a sulfur atom, or an oxygen atom, and in the aromatic or alicyclic group, at least one hydrogen to which carbon or nitrogen binds optionally is substituted with chlorine, bromine, fluorine, iodine, at least one alkyl group having carbon number from 1 to 15, at least one alkenyloxy group having carbon number from 2 to 9, an aromatic group that optionally is substituted with at least one alkyl group having carbon number from 1 to 15, or an alicyclic group that optionally is substituted with at least one alkyl group having carbon number from 1 to 15; A is nitrogen or sulfur; R is chlorine, bromine, fluorine, iodine, an alkyl group having carbon number from 1 to 15, an allyl group, an aromatic group that optionally is substituted with at least one alkyl group having carbon number from 1 to 15, or an alicyclic group that optionally is substituted with at least one alkyl group having carbon number from 1 to 15; n is an integer of 1 or 2 and indicates the number of R; when n is 2, two R groups optionally are the same or different, and optionally form a ring;

in formula (4), A is independently nitrogen, or sulfur, and $R^1$, $R^2$, $R^3$, $R^4$, $R^5$, and $R^6$ are each independently an alkyl group having carbon number from 1 to 25, an allyl group, an aralkyl group having an alkyl group having carbon number from 1 to 25, or an aryl group; in an aryl group of the aralkyl group and in a ring of the aryl group, at least one hydrogen optionally is substituted with fluorine, chlorine, an alkyl group having carbon number from 1 to 10, an alkenyl group having carbon number from 2 to 10, an alkoxy group having carbon number from 1 to 9, or an alkenyloxy group having carbon number from 2 to 9, and in these groups, at least one hydrogen optionally is substituted with fluorine or chlorine.

10. The semiconductor treatment liquid according to claim 1, wherein the semiconductor treatment liquid has a pH of 8 or higher and 14 or less at 25° C.

11. An etching method comprising bringing the semiconductor treatment liquid according to claim 1 into contact with a semiconductor wafer.

12. The etching method according to claim 11, wherein a metal on the semiconductor wafer is ruthenium or tungsten, and the method includes etching the ruthenium or the tungsten.

13. An inhibitor for $RuO_4$-containing gas generation, the inhibitor comprising:
(A) a hypobromite ion,
(B) a pH buffer,
(C) an onium ion, and
(E) one or more selected from the group consisting of a bromite ion and bromate ion.

14. The inhibitor for $RuO_4$-containing gas generation according to claim 13, further comprising (D) a bromide ion.

15. The inhibitor for $RuO_4$-containing gas generation according to claim 13, further comprising (F) one or more chlorine-containing ions selected from the group consisting of a chlorite ion, a chlorate ion, and a chloride ion.

16. A treatment agent for a ruthenium-containing waste liquid, the treatment agent comprising:
(A) a hypobromite ion,
(B) a pH buffer,
(C) an onium ion, and
(E) one or more selected from the group consisting of a bromite ion and bromate ion.

17. The treatment agent for a ruthenium-containing waste liquid according to claim 16, further comprising (D) a bromide ion.

18. The treatment agent for a ruthenium-containing waste liquid according to claim 16, further comprising (F) one or more chlorine-containing ions selected from the group consisting of a chlorite ion, a chlorate ion, and a chloride ion.

* * * * *